(12) United States Patent
Kim et al.

(10) Patent No.: US 10,580,733 B2
(45) Date of Patent: Mar. 3, 2020

(54) INTEGRATED CIRCUIT HAVING HETEROGENEOUS SOURCE/DRAIN AND GATE CONTACTS

(71) Applicant: SAMSUNG ELECTRONICS CO., LTD., Suwon-si, Gyeonggi-Do (KR)

(72) Inventors: Tae-hyung Kim, Yongin-si (KR); Jung-ho Do, Hwaseong-si (KR); Dae-young Moon, Yongin-si (KR); Sang-yeop Baeck, Yongin-si (KR); Jae-hyun Lim, Hwaseong-si (KR); Jae-seung Choi, Hwaseong-si (KR); Sang-shin Han, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/909,212

(22) Filed: Mar. 1, 2018

(65) Prior Publication Data

US 2018/0294219 A1    Oct. 11, 2018

(30) Foreign Application Priority Data

Apr. 10, 2017    (KR) .................. 10-2017-0046296

(51) Int. Cl.
*H01L 23/528*        (2006.01)
*H01L 27/088*        (2006.01)
(Continued)

(52) U.S. Cl.
CPC .... *H01L 23/528* (2013.01); *H01L 21/823871* (2013.01); *H01L 23/5226* (2013.01);
(Continued)

(58) Field of Classification Search
CPC .............. H01L 23/528; H01L 23/5283; H01L 23/5221; H01L 23/5226; H01L 23/535;
(Continued)

(56) References Cited

U.S. PATENT DOCUMENTS 8,766,322 B2    7/2014    Okamoto et al.
9,147,576 B2    9/2015    Horak et al.
(Continued)

FOREIGN PATENT DOCUMENTS

JP    2009267094    11/2009
KR   1020150081230    7/2015

OTHER PUBLICATIONS

Uyemura, John P.,"Physical Design of CMOS Integrated Circuits Using L-EDIT", PWS Publising Company, ISBN 0-534-94326-8, pp. 3-3 to 3-14, 1995.*

*Primary Examiner* — Younes Boulghassoul
(74) *Attorney, Agent, or Firm* — F. Chau & Associates, LLC

(57) ABSTRACT

Provided is an integrated circuit which includes: a plurality of conductive lines extending in a first horizontal direction on a plane separate from a gate line, and including first and second conductive lines; a source/drain contact having a bottom surface connected to a source/drain region, and including a lower source/drain contact and an upper source/drain contact which are connected to each other in a vertical direction; and a gate contact having a bottom surface connected to the gate line, and extending in the vertical direction, in which the upper source/drain contact is placed below the first conductive line, and the gate contact is placed below the second conductive line. A top surface of the lower source/drain contact may be larger than a bottom surface of the upper source/drain contact.

6 Claims, 19 Drawing Sheets

(51) Int. Cl.

| | | |
|---|---|---|
| *H01L 27/118* | (2006.01) | |
| *H01L 23/522* | (2006.01) | |
| *H01L 27/092* | (2006.01) | |
| *H01L 27/02* | (2006.01) | |
| *H01L 29/417* | (2006.01) | |
| *H01L 29/45* | (2006.01) | |
| *H01L 29/78* | (2006.01) | |
| *H01L 21/8238* | (2006.01) | |
| *H01L 21/8234* | (2006.01) | |

(52) U.S. Cl.
CPC ........ *H01L 27/0207* (2013.01); *H01L 27/088* (2013.01); *H01L 27/092* (2013.01); *H01L 27/11807* (2013.01); *H01L 29/41775* (2013.01); *H01L 29/45* (2013.01); *H01L 21/823475* (2013.01); *H01L 29/78* (2013.01); *H01L 2027/11875* (2013.01)

(58) Field of Classification Search
CPC . H01L 23/481; H01L 23/485; H01L 23/4855; H01L 21/823475; H01L 21/823871; H01L 21/76895; H01L 21/76877; H01L 21/76816; H01L 29/41775; H01L 29/41725; H01L 29/4232; H01L 21/76804; H01L 29/41791; H01L 27/088; H01L 27/0886; H01L 27/092; H01L 27/0924; H01L 27/11807
See application file for complete search history.

(56) References Cited

U.S. PATENT DOCUMENTS

| | | | |
|---|---|---|---|
| 9,245,076 B2 | 1/2016 | Gerousis et al. | |
| 9,349,598 B2 | 5/2016 | Horak et al. | |
| 9,431,300 B1* | 8/2016 | Zeng | H01L 27/0207 |
| 9,443,851 B2 | 9/2016 | Sengupta et al. | |
| 9,461,143 B2 | 10/2016 | Pethe et al. | |
| 9,947,589 B1* | 4/2018 | Park | H01L 21/76895 |
| 2013/0295756 A1* | 11/2013 | Yuan | H01L 21/823475 |
| | | | 438/586 |
| 2015/0035065 A1* | 2/2015 | Park | H01L 27/105 |
| | | | 257/368 |
| 2015/0084204 A1* | 3/2015 | Yun | H01L 21/76895 |
| | | | 257/773 |
| 2015/0194427 A1* | 7/2015 | Sengupta | H01L 27/0886 |
| | | | 257/401 |
| 2015/0235948 A1* | 8/2015 | Song | H01L 23/5283 |
| | | | 257/368 |
| 2015/0270176 A1 | 9/2015 | Xie et al. | |
| 2015/0357282 A1* | 12/2015 | Lau | H01L 23/5226 |
| | | | 257/401 |
| 2016/0027703 A1* | 1/2016 | Do | H01L 27/0207 |
| | | | 257/369 |
| 2016/0056153 A1* | 2/2016 | Do | H01L 27/11807 |
| | | | 257/390 |
| 2016/0359009 A1* | 12/2016 | Xie | H01L 29/4232 |
| 2017/0062403 A1* | 3/2017 | Song | H01L 27/11807 |
| 2017/0092764 A1* | 3/2017 | Xie | H01L 29/42356 |

* cited by examiner

INTEGRATED CIRCUIT HAVING HETEROGENEOUS SOURCE/DRAIN AND GATE CONTACTS

CROSS-REFERENCE TO RELATED APPLICATION

This application claims the benefit under 35 U.S.C. § 119 of Korean Patent Application No. 10-2017-0046296, filed on Apr. 10, 2017, in the Korean Intellectual Property Office, the disclosure of which is incorporated by reference herein in its entirety.

TECHNICAL FIELD

The inventive concept relates to an integrated circuit, and more particularly, to an integrated circuit having heterogeneous contacts and a semiconductor device including the integrated circuit.

DISCUSSION OF RELATED ART

Due to the increasing complexity and miniaturization of a semiconductor device, it may be limited to design the semiconductor device via a custom design. Thus, when the semiconductor device is designed, a layout of an integrated circuit which satisfies a function condition may be generated from a code of an upper level which is prepared according to a desired function, for example, the layout of the integrated circuit may be generated by placing and routing various standard cells. Accordingly, each of these standard cells may need to have a structure that is appropriate to be manufactured through minute semiconductor processes, and to have a cell size that is decreased to reduce an area of the layout of the integrated circuit.

SUMMARY

The inventive concept provides an integrated circuit having heterogeneous contacts, and a semiconductor device including the integrated circuit having a layout which includes efficiently-placed heterogeneous contacts.

According to an aspect of the inventive concept, there is provided an integrated circuit including: a first active region extending in a first horizontal direction on a substrate; a gate line extending in a second horizontal direction on the first active region, the second horizontal direction crossing the first horizontal direction; a source/drain region formed at one side of the gate line on the first active region; a plurality of conductive lines extending in the first horizontal direction on a plane separate from the gate line, and including first and second conductive lines; a source/drain contact having a bottom surface connected to the source/drain region, and including a lower source/drain contact and an upper source/drain contact which are connected to each other in a vertical direction; and a gate contact having a bottom surface connected to the gate line, and extending in the vertical direction, in which the upper source/drain contact is placed below the first conductive line, and the gate contact is placed below the second conductive line.

According to another aspect of the inventive concept, there is provided an integrated circuit including: a first active region and a second active region which extend parallel with each other in a first horizontal direction on a substrate; a plurality of gate lines extending in a second horizontal direction on the first and second active regions, the second horizontal direction crossing the first horizontal direction; a plurality of source/drain regions formed at respective sides of the plurality of gate lines on the first and second active regions; a plurality of conductive lines extending parallel with each other in the first horizontal direction on a plane separate from the plurality of gate lines; a plurality of source/drain contacts each having a bottom surface connected to one of the plurality of source/drain regions, and each extending in a vertical direction; and a plurality of gate contacts each having a bottom surface connected to one of the plurality of gate lines, and each including a lower gate contact and an upper gate contact which are connected to each other in the vertical direction, in which the plurality of source/drain contacts and upper gate contacts of the plurality of gate contacts are placed below the plurality of conductive lines, respectively.

According to another aspect of the inventive concept, there is provided an integrated circuit including: a first active region and a second active region extending parallel with each other in a first horizontal direction on a substrate; a plurality of gate lines disposed on the first and second active regions and extending in a second horizontal direction crossing the first horizontal direction; a plurality of source/drain regions formed at respective sides of the plurality of gate lines on the first and second active regions; a plurality of conductive lines extending parallel with each other in the first horizontal direction on a plane above and separate from the plurality of gate lines; a plurality of source/drain contacts each having a bottom surface connected to one of the plurality of source/drain regions, and each extending in a vertical direction; and a plurality of gate contacts each having a bottom surface connected to one of the plurality of gate lines, and extending in the vertical direction, in which the integrated circuit further includes at least one of: each of the plurality of gate contacts including a lower gate contact and an upper gate contact which are connected to each other in the vertical direction; and each of the plurality of source/drain contacts including a lower source/drain contact and an upper source/drain contact which are connected to each other in the vertical direction.

BRIEF DESCRIPTION OF THE DRAWINGS

Exemplary embodiments of the inventive concept will be more clearly understood from the following detailed description taken in conjunction with the accompanying drawings in which.

Figure 1A:
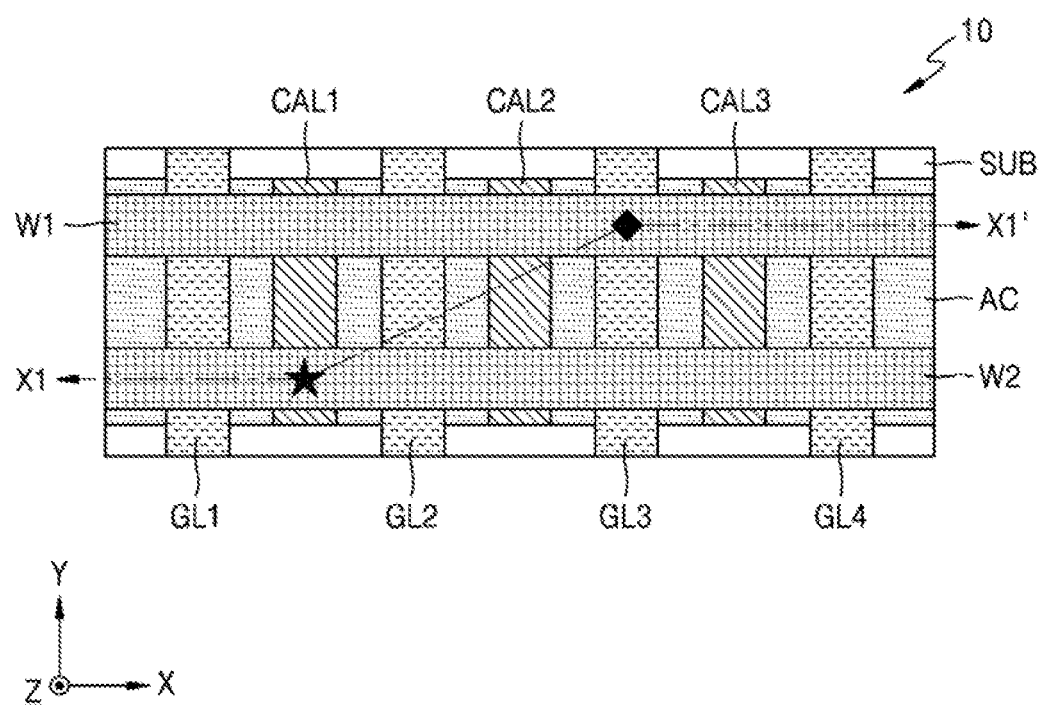
FIG. 1A illustrates a layout of an integrated circuit according to an exemplary embodiment of the inventive concept, and FIGS. 1B and 1C each illustrates an example of a cross section of the integrated circuit, taken along line X1-X1' of FIG. 1A according to an exemplary embodiment of the inventive concept.

Since the drawings in FIGS. 1-12 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Figure 1B:
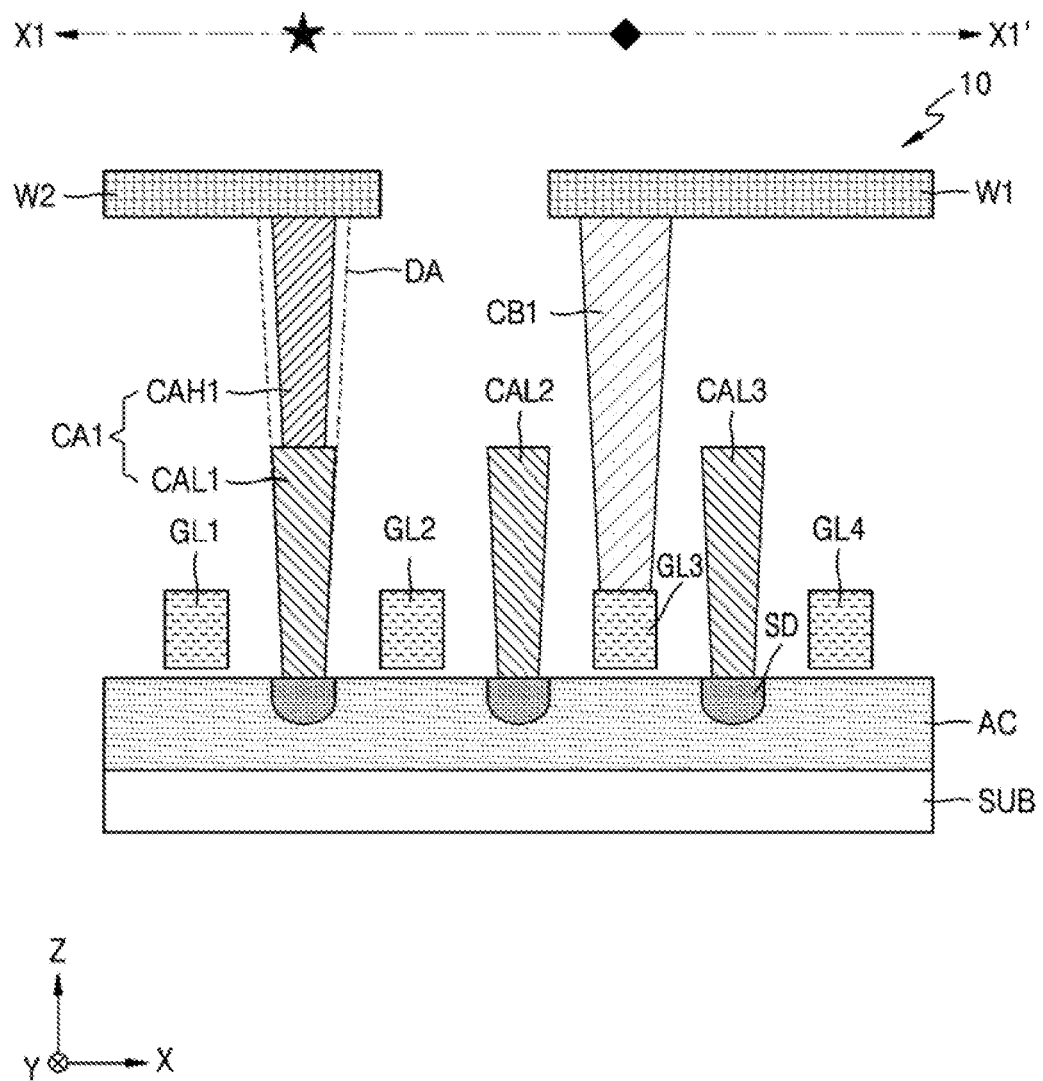
Figure 1C:
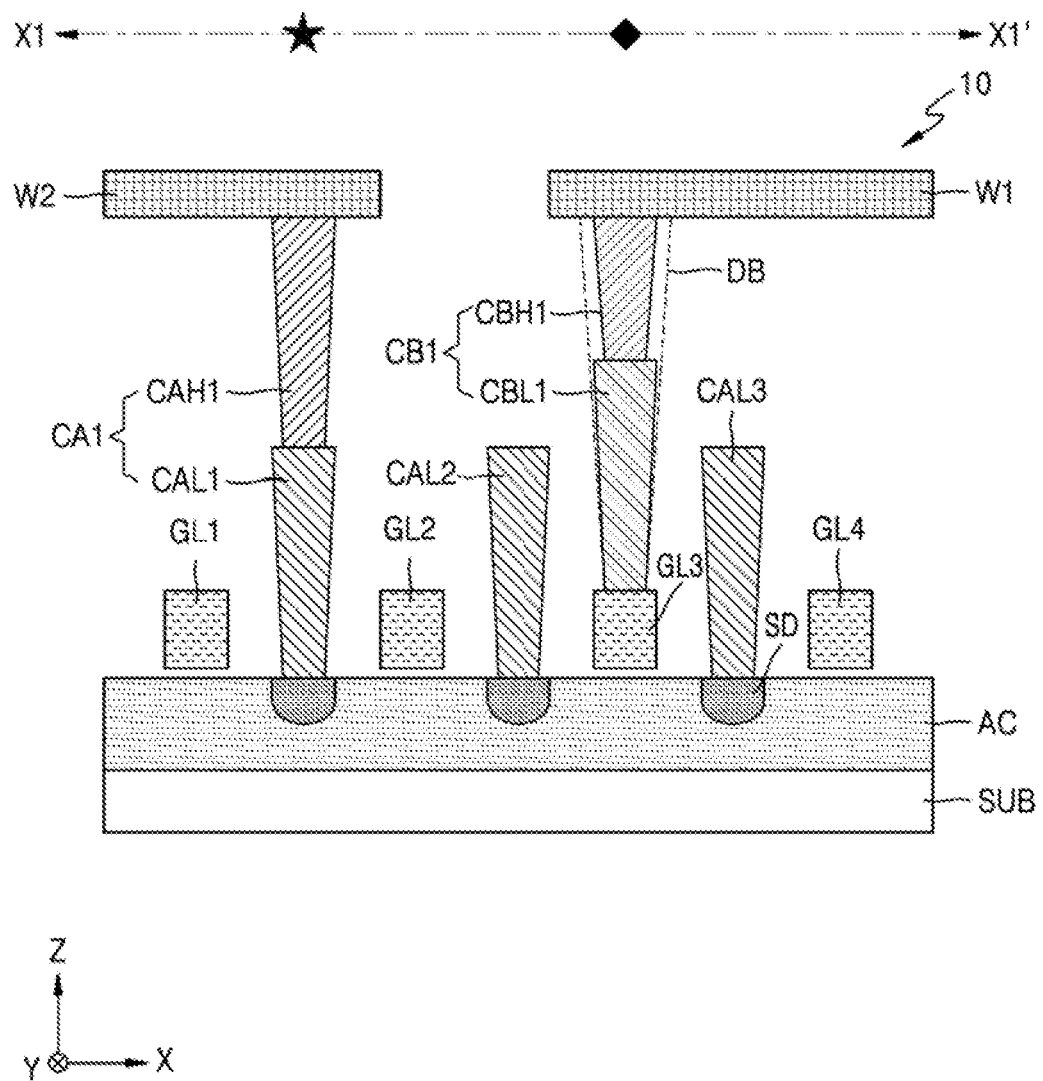

FIG. 1A illustrates a layout of an integrated circuit 10 according to an exemplary embodiment of the inventive concept. FIGS. 1B and 1C each illustrates an example of a cross section of the integrated circuit 10, taken along line X1-X1' of FIG. 1A, according to an exemplary embodiment of the inventive concept. In more detail, FIG. 1A is a plan view of a plane with an X-axis and a Y-axis in the layout of the integrated circuit 10, and FIGS. 1B and 1C are cross-sectional views of the layout of the integrated circuit 10, taken along line X1-X1' of FIG. 1A with the cross-section direction (plane) in parallel with a Z-axis. In the present application, the plane with the X-axis and the Y-axis may be referred to as a horizontal plane, and an element placed in a +Z direction relatively to another element may be described to be over the other element, and an element placed in a −Z direction relatively to another element may be described to be below the other element. In addition, a surface that is from among surfaces of an element and is in the +Z direction may be referred to as a top surface of the element, a surface in the −Z direction may be referred to as a bottom surface of the element, and a surface in either the X-axis direction or the Y-axis direction may be referred to as a side surface of the element. The X-axis direction may be referred to as a first horizontal direction, the Y-axis direction may be referred to as a second horizontal direction, and the second horizontal direction crossing the first horizontal direction.

Referring to FIGS. 1A through 1C, an active region AC extends in the X-axis direction on a substrate SUB having a surface that is parallel with the horizontal plane. The active region AC may include a semiconductor such as, for example, silicon (Si) or germanium (Ge), or a compound semiconductor such as, for example, silicon germanium (SiGe), silicon carbide (SiC), gallium arsenide (GaAs), indium arsenide (InAs), or indium phosphide (InP). The active region AC may include a conductive region, e.g., a well doped with impurities, and a structure doped with impurities. Gate lines GL1 through GL4 may extend in the Y-axis direction on the active region AC, and a source/drain region SD may be formed in the active region AC at one side of each of the gate lines GL1 through GL4. Conductive lines W1 and W2 may extend in the X-axis direction on a plane separate from the gate lines GL1 through GL4, in which the plane may be above the gate lines GL1 through GL4. The conductive lines W1 and W2, that may be referred to as local interconnects, may interconnect contacts placed at different positions, and may be connected to an upper pattern of the conductive lines W1 and W2.

As illustrated in FIG. 1B, a source/drain contact CA1 may have a bottom surface connected to the source/drain region SD, and may include a lower source/drain contact CAL1 and an upper source/drain contact CAH1 that are connected to each other in the Z-axis direction (or a vertical direction). Due to the lower and upper source/drain contacts CAL1 and CAH1, the source/drain contact CA1 may have a decreased horizontal cross-sectional area in the upper source/drain contact CAH1 portion. For example, when a depth of an integrally-formed contact, i.e., a length in the Z-axis direction, is increased, an area ratio of a top surface to a bottom surface is increased, thus, in a different manner from what is illustrated in FIG. 1B, when the source/drain contact CA1 extends from a top surface of the source/drain region SD to a bottom surface of the conductive line W2 in the Z-axis direction, the source/drain contact CA may have an outline as illustrated using a broken line DA. The upper source/drain contact CAH1 may be placed below and connected to the conductive line W2, and a gate contact CB1 may be placed below and connected to the conductive line W1 as shown in FIG. 1B. Also, as illustrated in FIG. 1B, a top surface of the lower source/drain contact CAL1 is larger than a bottom surface of the lower source/drain contact CAL1, and a top surface of the higher source/drain contact CAH1 is larger than a bottom surface of the higher source/drain contact CAH1. When the lower source/drain contact CAL1 and the higher source/drain contact CAH1 have the same or similar sidewall slope, to confine the sidewalls of the higher source/drain contact CAH1 within the broken line DA, the top surface of the lower source/drain contact CAL1 is larger than the bottom surface of the higher source/drain contact CAH1.

Due to the decreased horizontal cross-sectional arm of the source/drain contact CA1 in the upper portion, a bridge (or a contact mutual-bridge as will be described below with reference to FIG. 3B) that may occur between the source/drain contact CA1 and a gate contact adjacent thereto may be prevented. In addition, because a risk of the bridge occurring is removed, a degree of freedom with respect to placing the source/drain contact CA1 and/or the gate contact may be increased, e.g., as illustrated in FIGS. 1A through 1C, the gate contact CB1 may be placed over the active region AC.

Because no upper source/drain contacts to be connected are placed at lower source/drain contacts CAL2 and CAL3 each having a bottom connected to the source/drain region SD, a source/drain contact that connects the source/drain region SD with the conductive line W1 or W2 may not be formed for each of the lower source/drain contacts CAL2 and CAL3. In addition, in an exemplary embodiment of the inventive concept, lower source/drain contacts CAL2 and CAL3 that are not connected to upper source/drain contacts in the integrated circuit 10 may be omitted. As illustrated in FIGS. 1A through 1C, in drawings of the present application, a point at which a source/drain contact (e.g., the source/drain contact CA1) is placed to interconnect the source/drain region SD and an upper layer pattern (e.g., the conductive line W2) may be marked as '★'.

The gate lines GL1 through GL4 may include a work function metal containing layer and a gap-fill metal layer. For example, the work function metal containing layer may include at least one metal of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (b), dysprosium (Dy), erbium (Er), and palladium (Pd), and the gap-fill metal layer may be formed as a tungsten (W) layer or an aluminum (Al) layer. In an exemplary embodiment of the inventive concept, the gate lines GL1 through GL4 may include a stack structure of titanium aluminum carbide/titanium nitride/tungsten (TiAlC/TiN/W), a stack structure of titanium nitride/tantalum nitride titanium aluminum carbide/titanium nitride/tungsten (TiN/TaN/TiAlC/TiN/W), or a stack structure of titanium nitride/tantalum nitride/titanium nitride/titanium aluminum carbide/titanium nitride/tungsten (TiN/TaN/TiN/TiAlC/TiN/W).

The gate contact CB1 may have a bottom surface connected to the gate line GL3 and may extend in the Z-axis direction. In an exemplary embodiment of the inventive concept, as illustrated in FIG. 1B, the gate contact CB1 may be formed as one body. That is, the gate contact CB1 of FIG. 1B may not be formed of at least two deposition processes that are divided by an etching process. In an exemplary embodiment of the inventive concept, as illustrated in FIG. 1C, a gate contact CB1 may include a lower gate contact CBL1 and an upper gate contact CBH1 that are connected to each other in the Z-axis direction. As illustrated with a broken line DB in FIG. 1C, the gate contact CB1 of FIG. 1C which includes the lower gate contact CBL1 and the upper gate contact CBH1 may have a decreased horizontal cross-sectional area in the upper source/drain contact CBH1 portion, compared to the gate contact CB1 of FIG. 1B which is formed as one body. As illustrated in FIGS. 1A through 1C, in drawings of the present application, a point at which a gate contact (e.g., the gate contact CB1) of FIG. 1B or an upper gate contact (e.g., the upper gate contact CBH1) of FIG. 1C is placed to interconnect the gate contact CB1 and an upper layer pattern (e.g., the conductive line W1) may be marked as '◆'. The upper source/drain contact CAH1 may be placed below and connected to the conductive line W2, and the upper gate contact CBH1 may be placed below and connected to the conductive line W1 as shown in FIG. 1C. Also, as illustrated in FIG. 1C, a top surface of the lower gate contact CBL1 is larger than a bottom surface of the lower gate contact CBL1, and a top surface of the higher gate contact CBH1 is larger than a bottom surface of the higher gate contact CBH1. When the lower gate contact CBL1 and the higher gate contact CBH1 have the same or similar sidewall slope, to confine the sidewalls of the higher source/drain contact CBH1 within the broken line DB, the top surface of the lower gate contact CBL1 is larger than the bottom surface of the higher gate contact CBH1.

In an exemplary embodiment of the inventive concept, as illustrated in FIG. 1C, the lower source/drain contact CAL1 and the lower gate contact CBL1 may extend to different levels in the Z-axis direction. That is, the top surface of the lower source/drain contact CAL1 and the top surface of the lower gate contact CBL1 may be at planes at different levels. In an exemplary embodiment of the inventive concept, in a different manner from what is illustrated in FIG. 1C, the lower source/drain contact CAL1 and the lower gate contact CBL1 may each extend to a plan at the same level in the Z-axis direction.

In an exemplary embodiment of the inventive concept, an integrated circuit may have some portion similar to the structure shown in FIG. 1C, for example, the gate contact CB1 may include the lower gate contact CBL1 and the upper gate contact CBH1 that are connected to each other in the Z-axis direction, and may have some portion different from the structure shown in FIG. 1C, for example, the source/drain contact CA1 may be formed as one body. Also, in an exemplary embodiment of the inventive concept, an integrated circuit may include at least one of each of a plurality of gate contacts (e.g., CB1) having a lower gate contact (e.g., CBL1) connected to an upper gate contact (e.g., CBH1) in the vertical direction; and each of a plurality of the source/drain contacts (e.g., CA1) having a lower source/drain contact (e.g., CAL1) connected to an upper source/drain contact (e.g., CAH1) in the vertical direction.

According to an exemplary embodiment of the inventive concept, the integrated circuit 10 may include a plurality of conductive lines that are parallel with each other in one direction, and a source/drain contact and/or a gate contact may be connected to the plurality of conductive lines. For example, as illustrated in FIG. 1A, the conductive lines W1 and W2 may extend in the X-axis direction, the source/drain contact CA1 may be connected to the conductive line W2 at the point '★', and the gate contact CB1 may be connected to the conductive line W1 at the point '◆'. Accordingly, the source/drain contact and the gate contact having an enhanced degree of freedom with respect to placement in the integrated circuit 10 may be placed based on a certain rule, and as a result, the integrated circuit 10 may have a layout of a simple and efficient process structure. As described above, the source/drain contact and the gate contact (including the upper source/drain contact and/or the upper gate contact) may have the bottom surfaces placed at different levels, or may have different vertical structures, so that the source/drain contact and the gate contact may be called 'heterogeneous contacts'.

Figure 2A:
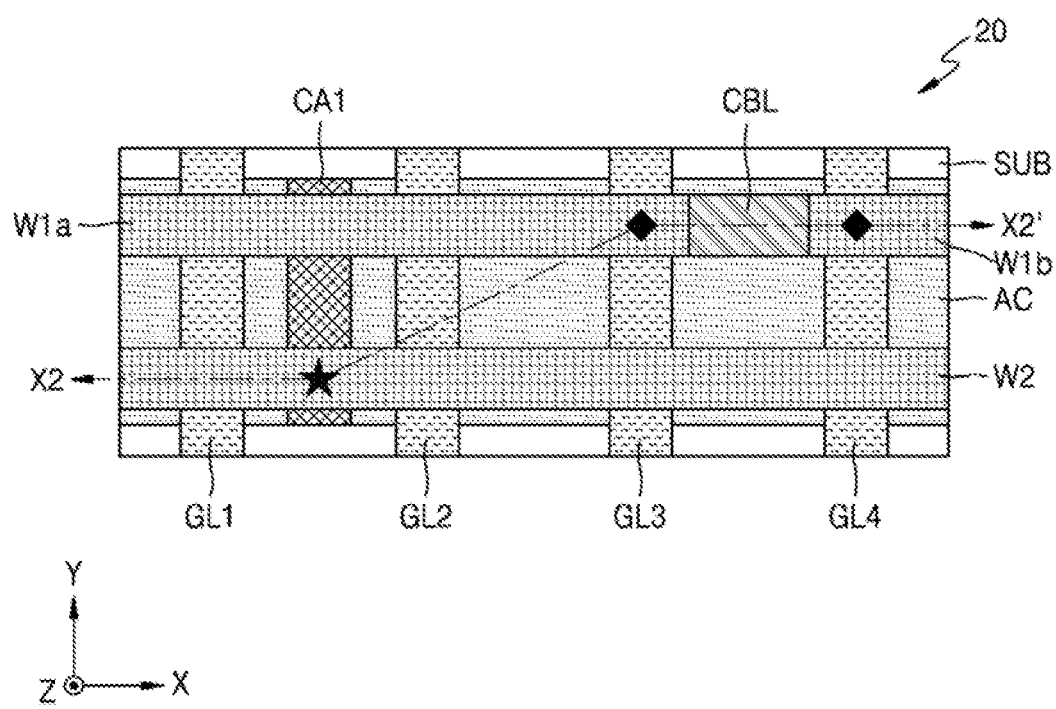
FIG. 2A illustrates a layout of an integrated circuit according to an exemplary embodiment of the inventive concept.
Figure 2B:
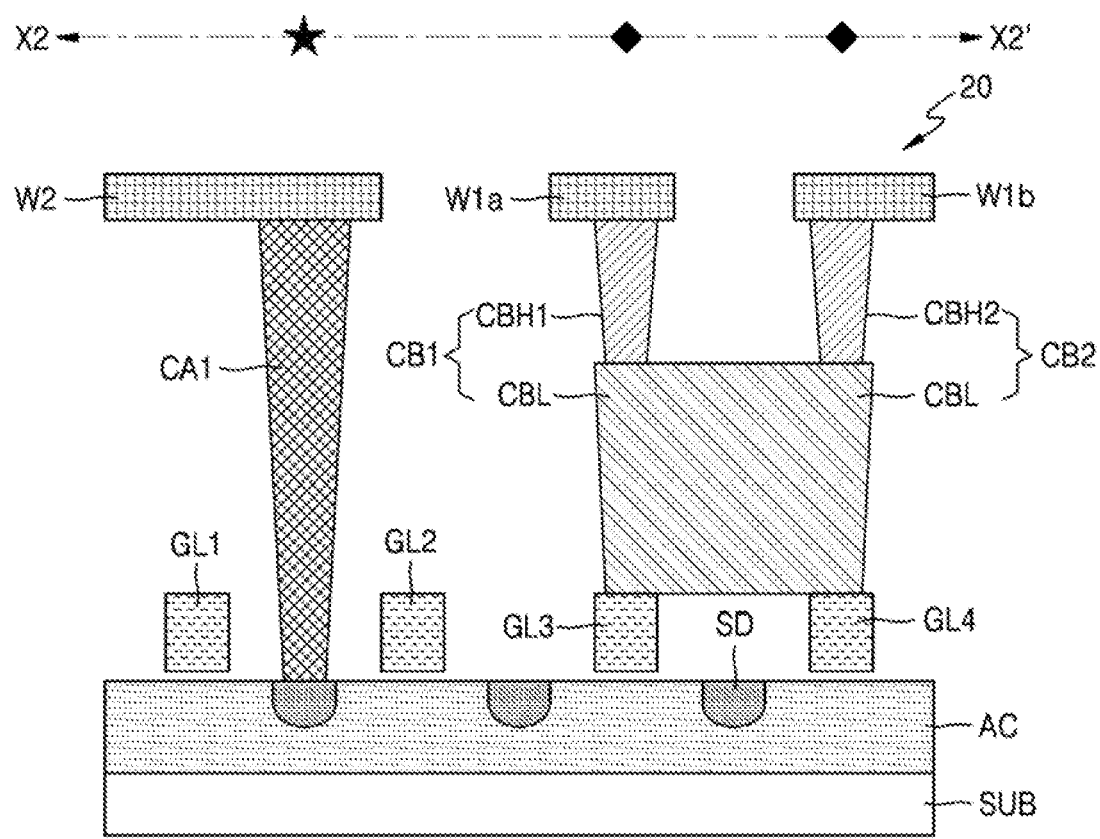
FIG. 2B illustrates a cross section of the integrated circuit taken along line X2-X2' of FIG. 2A.

FIG. 2A illustrates a layout of an integrated circuit 20, according to an exemplary embodiment of the inventive concept. FIG. 2B illustrates a cross section of the integrated circuit 20, taken along line X2-X2' of FIG. 2A. In more detail, FIG. 2A is a plan view of a plane with an X-axis and a Y-axis in the layout of the integrated circuit 20, and FIG. 2B is a cross-sectional view of the layout of the integrated circuit 20, taken along line X2-X2' of FIG. 2A with the cross-section direction (plane) in parallel with a Z-axis. Hereinafter, descriptions of the integrated circuit 20 in FIGS. 2A and 2B which are the same as the descriptions of the integrated circuit 10 in FIGS. 1A through 1C will be omitted.

Referring to FIGS. 2A and 2B, a source/drain contact CA1 may be formed as one body, a gate contact CB1 may include a lower gate contact CBL and an upper gate contact CBH1 that are connected to each other in the Z-axis direction, and a gate contact CB2 may include a lower gate contact CBL and an upper gate contact CBH2 that are connected to each other in the Z-axis direction. As illustrated in FIG. 2B, the lower gate contact CBL may be connected to two gate lines GL3 and GL4, and the two upper gate contacts CBH1 and CBH2 may respectively extend from a top surface of the lower gate contact CBL to bottom surfaces of conductive lines W1a and W1b in the Z-axis direction and respectively connected to the conductive lines W1a and W1b.

Figure 3A:
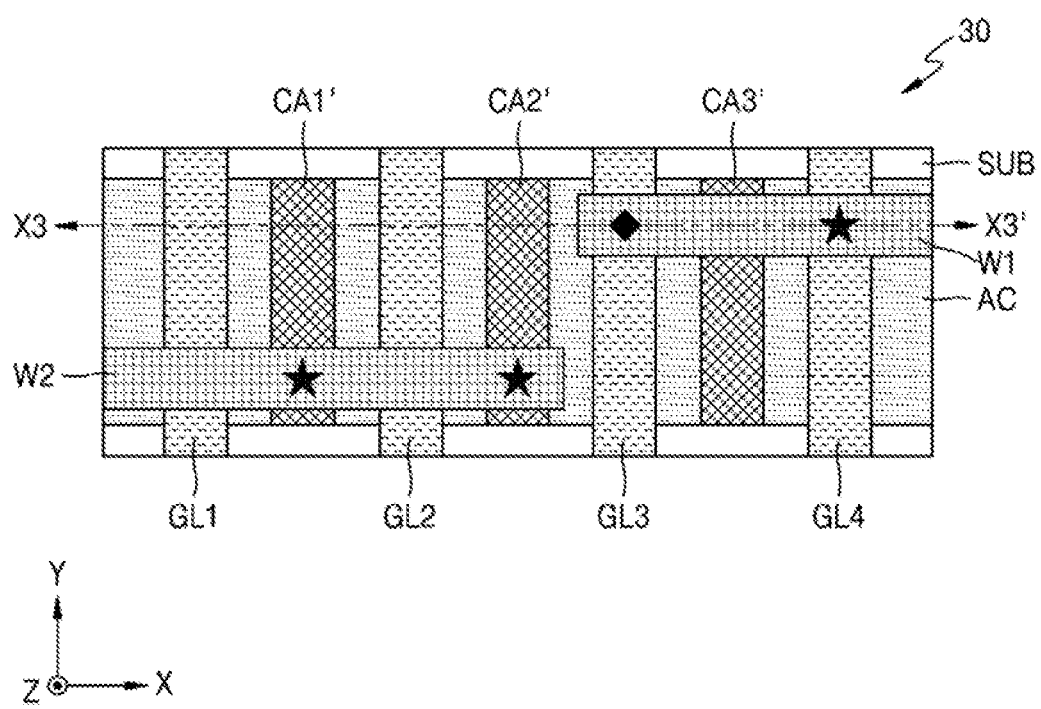
FIG. 3A illustrates a layout of an integrated circuit according to a comparative example.

FIG. 3A illustrates a layout of an integrated circuit 30, according to a comparative example. FIG. 3B illustrates a cross section of the integrated circuit 30, taken along line X3-X3' of FIG. 3A. In more detail, FIG. 3A is a plan view of a plane with an X-axis and a Y-axis in the layout of the integrated circuit 30, and FIG. 3B is a cross-sectional view of the layout of the integrated circuit 30, taken along line X3-X3' of FIG. 3A with the cross-section direction (plane) in parallel with a Z-axis. In the integrated circuit 30 of FIGS. 3A and 3B, a source/drain contact that connects a source/drain region with a conductive line may be formed as one body, which is different from what is illustrated in FIGS. 1A through 1C.

Figure 3B:
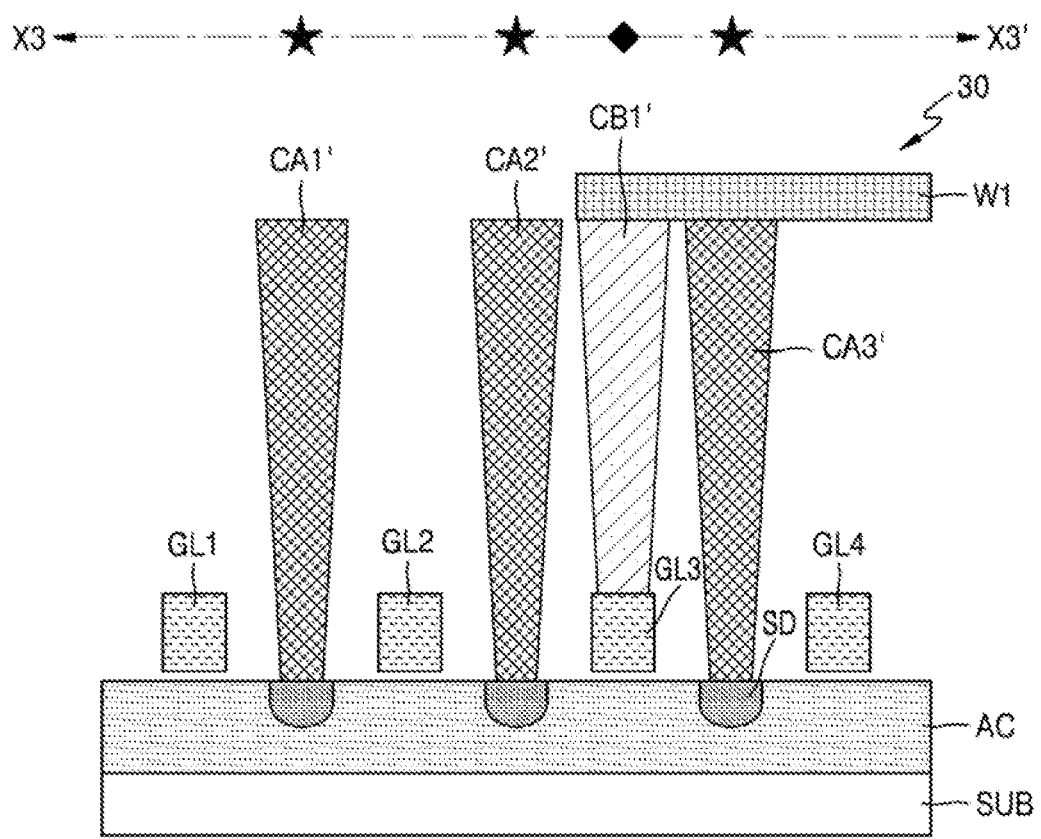
FIG. 3B illustrates a cross section of the integrated circuit taken along line X3-X3' of FIG. 3A.

Referring to FIGS. 3A and 3B, an active region AC may extend in the X-axis direction on a substrate SUB, gate lines GL1 through GL4 may extend in the Y-axis direction on the active region AC, and a source/drain region SD may be formed at one side of each of the gate lines GL1 through GL4 on the active region AC. In addition, conductive lines W1 and W2 may extend in the X-axis direction on a plane separate from the gate lines GL1 through GL4.

In the comparative example of FIGS. 3A and 3B, a source/drain contact is formed as one body, and a gate contact is formed as one body, such that a bridge may occur between the source/drain contact (e.g., CA2' or CA3') and the gate contact (e.g., CB1'). This is due to the large horizontal cross-sectional areas of the top surfaces of the source/drain contact (e.g., CA2' or CA3') and the gate contact (e.g., CB1'). As shown in FIG. 3A, the source/drain contacts CA1' and CA2' are connected to the conductive line W2, and the source/drain contact CA3' is connected to the conductive line W1. As illustrated in FIG. 3B, the gate contact CB1' that has a bottom surface connected to the gate line GL3 and has a top surface connected to the conductive line W1 may be very close to the source/drain contacts CA2' and CA3' in a periphery of a bottom surface of the conductive line W1, such that a bridge may occur between the gate contact CB1' and the source/drain contact CA2' or CA3'. Because both the gate contact CB1' and the source/drain contact CA3' are connected to the conductive line W1, the bridge occurring between the gate contact CB1' and the source/drain contact CA2' may not cause a functional error in the integrated circuit 30. On the other hand, the bridge occurring between the gate contact CB1' and the source/drain contact CA2' may cause short among different nets in the integrated circuit 30, such that the bridge may cause a functional error or a leakage current in the integrated circuit 30.

In the comparative example of FIGS. 3A and 3B, a gate contact may not be placed on the active region AC so as to prevent the formation of a contact mutual-bridge, and may be separate from the active region AC by a predetermined distance in a horizontal direction (e.g., the second horizontal direction). Thus, a layout of the integrated circuit 30 may require extra space for placement of a gate contact between active regions, such that an area of the layout of the integrated circuit 30 may be increased. In addition, due to a decreased degree of freedom with respect to placement of the gate contact CB1', the layout of the integrated circuit 30 may have a complicated structure.

Figure 4:
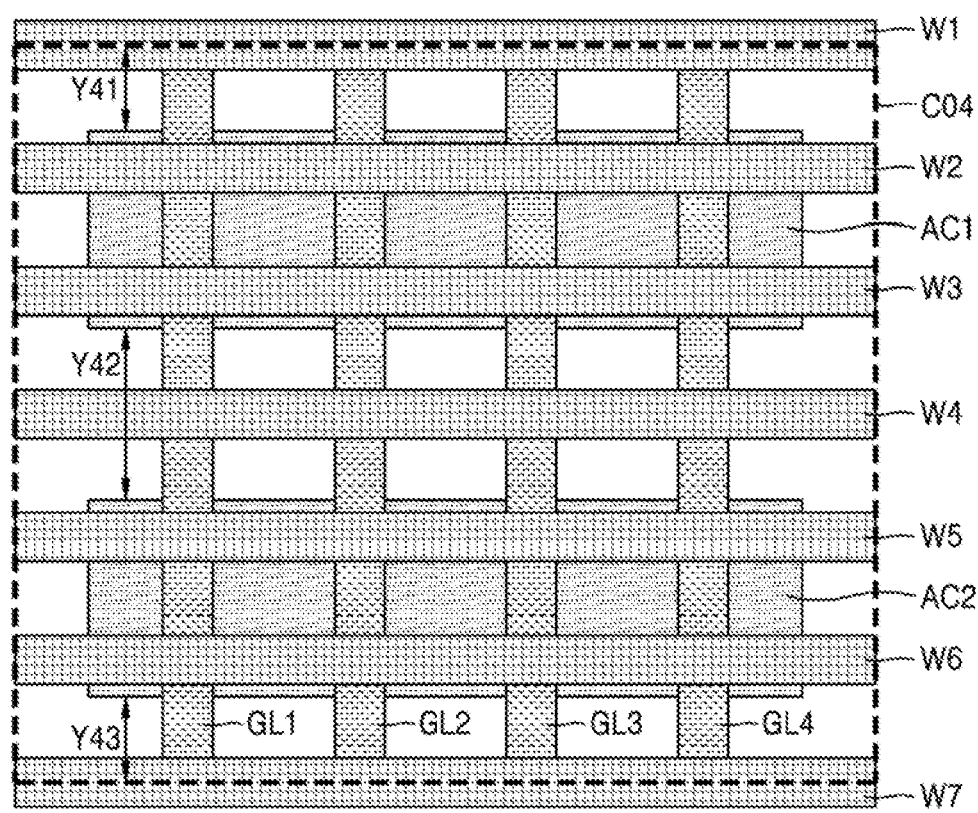
FIG. 4 illustrates a standard cell according to an exemplary embodiment of the inventive concept.

FIG. 4 illustrates a standard cell C04, according to an exemplary embodiment of the inventive concept. In more detail, FIG. 4 is a plan view of a plane with an X-axis and a Y-axis in the standard cell C04.

A standard cell is a unit of a layout which is included in an integrated circuit (e.g., the integrated circuit 10 of FIG. 1A), and the integrated circuit may include a plurality of various standard cells. The standard ell may have a structure based on a predefined standard. For example, the standard cell may have a height, i.e., a length in the Y-axis direction, and may include a gate line and an active region which re placed in the standard cell based on a predetermined rule. FIG. 4 illustrates the standard cell C04 as an example, but the inventive concept is not limited thereto. For example, the standard cell may have a length in the X-axis direction which is different from what is illustrated in FIG. 4, and/or may include a number of site lines with the number being different from what is illustrated in FIG. 4.

Referring to FIG. 4, the standard cell C04 may include a first active region AC1 and a second active region AC2 which extend in the X-axis direction and are separate from each other, and may include gate lines GL1 through GL4 extending in the Y-axis direction disposed on and crossing the first and second active regions AC1 and AC2. In addition, the standard cell C04 may include conductive lines W1 through W7 that extend in the X-axis direction on a plane separate from the gate lines GL1 through GL4, in which the plane may be above the gate lines GL1 through GL4. In addition, as described above with reference to FIGS. 1A through 1C, a source/drain contact and/or a gate line contact may be connected to the conductive lines W1 through W7.

The first active region AC1 and the second active region AC2 may have different conductive types. For example, the first active region AC1 may be formed of an n-type semiconductor so as to form a p-channel metal-oxide-semiconductor field-effect transistor (PMOS transistor) with the gate lines GL1 through GL4, and the second active region AC2 may be formed of a p-type semiconductor so as to form an n-channel metal-oxide-semiconductor field-effect transistor (NMOS transistor) with the gate lines GL1 through GL4. In this manner, the first and second active regions AC1 and AC2 having different conductive types may be separate from each other by at least a predetermined distance so as to prevent a problem in semiconductor manufacturing processes and/or deterioration in a function of transistors respectively formed in the first and second active regions AC1 and AC2. The problem may be the formation of the contact mutual-bridge described above, or may be other problem. The deterioration in the function of the transistors may be due to short occurred among different nets in the integrated circuit causing a functional error of the transistors, or may be other deterioration. A minimum distance between the first active region AC1 and the second active region AC2 may be referred to as an active-to-active minimum space. The active-to-active minimum space may be defined by a design rule in designing the integrated circuit, so that the layout or the standard cell of the integrated circuit may be designed to satisfy the design rule. That is, Y42 of FIG. 4, which is a distance between the first active region AC1 and the second active region AC2, may be equal to or greater than the active-to-active minimum space.

Referring to FIG. 4, the standard cell C04 may satisfy the design rule, such that the first active region AC1 may be separate in the Y-axis direction by a half of the active-to-active minimum space from a boundary of the standard cell C04 in a +Y direction, in consideration of another standard cell that may be placed in the +Y direction of the standard cell C04 and another standard cell that may be placed in a −Y direction of the standard cell C04. That is, Y41 of FIG. 4 may be the same as the half of the active-to-active minimum space. Similarly, the second active region AC2 may also be separate by the half of the active-to-active minimum space from a boundary of the standard cell C04 in the −Y direction, and Y43 of FIG. 4 may be the same as the half of the active-to-active minimum space.

In the comparative example of FIGS. 3A and 3B, the gate contact may not be placed on the active region AC so as to prevent the formation of the contact mutual-bridge, such that the gate contact in a standard cell may be placed over a region between the active regions AC. In addition, in order to additionally prevent the bridge that may occur between the source/drain contact and the gate contact placed over the active region AC, in the comparative example of FIGS. 3A and 3B, the gate contact may be separate from the active region AC by the predetermined distance in the horizontal direction (e.g., the second horizontal direction). In the standard cell where the gate contact is placed over the region between the active regions AC, the active regions AC may be separate to provide spaces for gate contacts with respect to each of a PMOS transistor and an NMOS transistor which are aligned in the Y-axis direction in which gates are not shared therebetween, such that the active regions AC may be further separate to a space larger than the active-to-active minimum space. That is, to prevent the formation of the contact mutual-bridge, the layout in the comparative example of FIGS. 3A and 3B may require a larger area, and may have a more complex structure.

In addition, due to an increased degree of freedom with respect to placement of the source/drain contact and the gate contact according to the present exemplary embodiment of the inventive concept, active regions in a standard cell may be separate from each other by the active-to-active minimum space. As described above with reference to FIGS. 1A through 1C, 2A, and 2B, because the gate contact may be placed over the active region, and a minimum distance between the source/drain contact and the gate contact is removed, the active regions in a standard cell may be separate from each other by the active-to-active minimum space. That is, in the standard cell C04 of FIG. 4, the first and second active regions AC1 and AC2 may be separate from each other by the active-to-active minimum space, and Y42 of FIG. 4 may be the same as the active-to-active minimum space. Accordingly, the length of the standard cell C04 in the Y-axis direction may be decreased, such that the layout of the integrated circuit including the plurality of standard cells may have a decreased area. The standard cell C04 of FIG. 4 described above may have heterogeneous contacts, so that the formation of the contact mutual-bridge may be prevented, and as a result, the gate contact may be placed over the active region as described above with reference to FIGS. 1A through 1C, 2A, and 2B.

As illustrated in FIG. 4, due to an increased degree of freedom with respect to placement of the source/drain contact and the gate contact according to the present exemplary embodiment of the inventive concept, the conductive lines W1 through W7 that are connected to the source/drain contact and/or the gate contact in the standard cell C04 may extend in one direction (that is, the X-axis direction), so that the standard cell C04 may have a simple structure. For example, as will be described below with reference to comparative examples of FIGS. 9A and 10A, because semiconductor components and processes are becoming more miniaturized and complex, it may not be easy to precisely form a pattern having a bending shape, a notch shape, or the like. Accordingly, removing, from a layout of an integrated circuit, of patterns having a shape that is not easily formed during semiconductor processes may be very efficient in terms of achieving in enhancing reliability of a function of the integrated circuit and increasing productivity of the integrated circuit. According to the present exemplary embodiment of the inventive concept, the standard cell C04 that is illustrated in FIG. 4 based on the increased degree of freedom with respect to placement of the source/drain contact and the gate contact may include the conductive lines W1 through W7 extending in one direction, and according to standard cells, at least some of the conductive lines W1 through W7 may be removed via an etching process. Accordingly, reliability of a function of the integrated circuit and productivity of the integrated circuit, in which the integrated circuit includes standard cells having a simple structure, may be enhanced.

Figure 5:
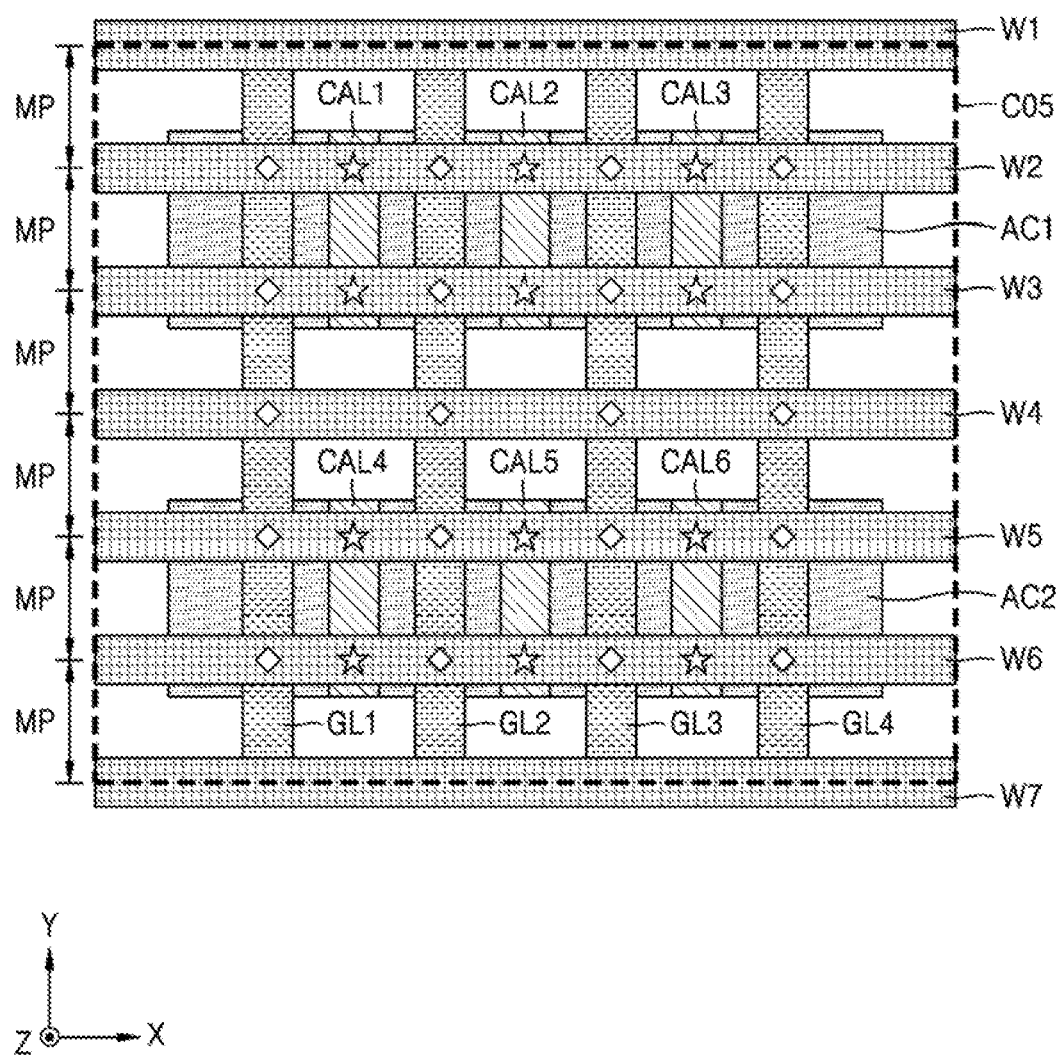
FIGS. 5 and 6 each illustrates a standard cell according to an exemplary embodiment of the inventive concept.
Figure 6:
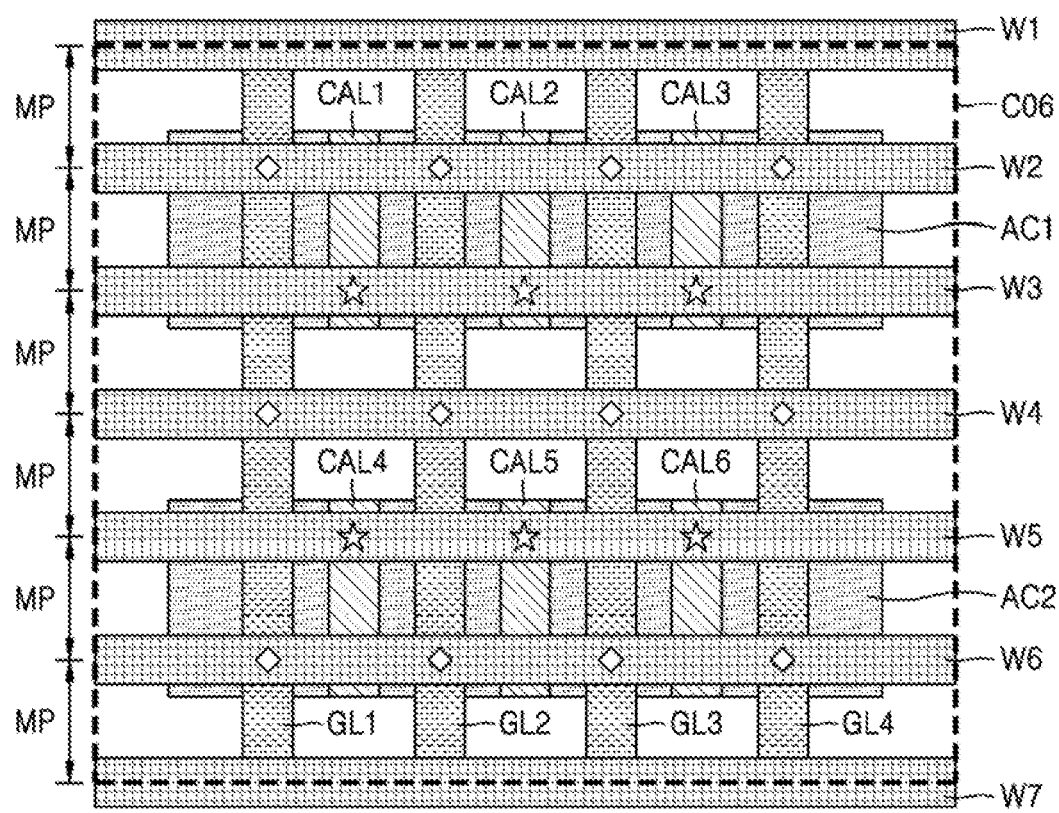

FIGS. 5 and 6 illustrate standard cells C05 and C06, respectively, according to an exemplary embodiment of the inventive concept. In more detail, FIGS. 5 and 6 are plan views of a plane with an X-axis and a Y-axis in the standard cells C05 and C06, and illustrate candidate points at which a source/drain contact and a gate contact may be connected to conductive lines W1 through W7. The standard cell C05 of FIG. 5 and the standard cell C06 of FIG. 6 may have the same structure in general, and may have different candidate points for the source/drain contact and the gate contact. Hereinafter, descriptions of FIG. 6 which are the same as descriptions of FIG. 5 will be omitted.

Referring to FIG. 5, the standard cell C05 may include a first active region AC1 and a second active region AC2 which extend in the X-axis direction and are separate from each other, and may include gate lines GL1 through GL4 extending in the Y-axis direction disposed on and crossing the first and second active regions AC1 and AC2. In addition, the standard cell C05 may include the conductive lines W1 through W7 that extend in the X-axis direction on a plane separate from the gate lines GL1 through GL4 (i.e., the plane of the conductive lines W1 through W7 is in a +Z direction of the gate lines GL1 through GL4), and the source/drain contact and the gate contact may be connected to the conductive lines W1 through W7. As illustrated in FIG. 5, the conductive lines W1 through W7 in the standard cell C05 may be separate from each other by a predetermined distance, i.e., MP, and may extend in parallel in the X-axis direction. Here, MP is the distance between center lines (not the distance of the gap) of two immediately adjacent conductive lines among the conductive lines W1 through W7.

Referring to FIG. 5, the source/drain contact may be connected to the conductive lines W1 through W7 at points at which lower source/drain contacts CAL1 through CAL6 and the conductive lines W1 through W7 cross each other. For example, the lower source/drain contacts CAL1 through CAL6 may be present over the first and second active regions AC1 and AC2, and upper source/drain contacts may be placed at points marked as '☆' on the lower source/drain contacts CAL1 through CAL6. That is, '☆' of FIG. 5 may represent candidate points at which the upper source/drain contacts may be placed.

The gate contact may be connected to the conductive lines W1 through W7 at points at which the gate lines GL1 through GL4 and the conductive lines W1 through W7 cross each other. For example, the gate contact may be placed at each point marked as '◇' over the gate lines GL1 through GL4. That is, '◇' of FIG. 5 may represent candidate points at which the gate contacts may be placed.

As illustrated in FIG. 5, the candidate points at which the source/drain contacts may be connected to the conductive lines W1 through W7 and the candidate points at which the gate contacts may be connected to the conductive lines W1 through W7 may be plural in the standard cell C05. Accordingly, a degree of freedom with respect to placement of the source/drain contact (or the upper source/drain contact) and the gate contact in the standard cell C05 may be enhanced, so that the standard cell C05 having a simple structure appropriate for semiconductor processes may be available.

In an exemplary embodiment of the inventive concept, some of the candidate points in the standard cell C05 of FIG. 5 may not be used. For example, in the standard cell C06 of FIG. 6, candidate points may be placed to remove a case in which an upper source/drain contact and a gate contact are placed adjacent to each other, i.e., the case in which the upper source/drain contact and the gate contact which are adjacent to each other are connected to the same conductive line. Also, in an exemplary embodiment of the inventive concept, the candidate points are placed differently from the standard cell C06 of FIG. 6. For example, in the candidate points placed in the standard cell C05 of FIG. 5, the upper source/drain contact and the gate contact may be placed adjacent to each other, i.e., the upper source/drain contact and the gate contact which are adjacent to each other are connected to the same conductive line. In addition, the candidate points may be placed differently from the standard cells C05 of FIG. 5 and C06 of FIG. 6. For example, in a standard cell, some of the candidate points in the standard cell C05 of FIG. 5 may not be used, but more candidate points than those in the standard cell C06 of FIG. 6 may be used.

Figure 7:
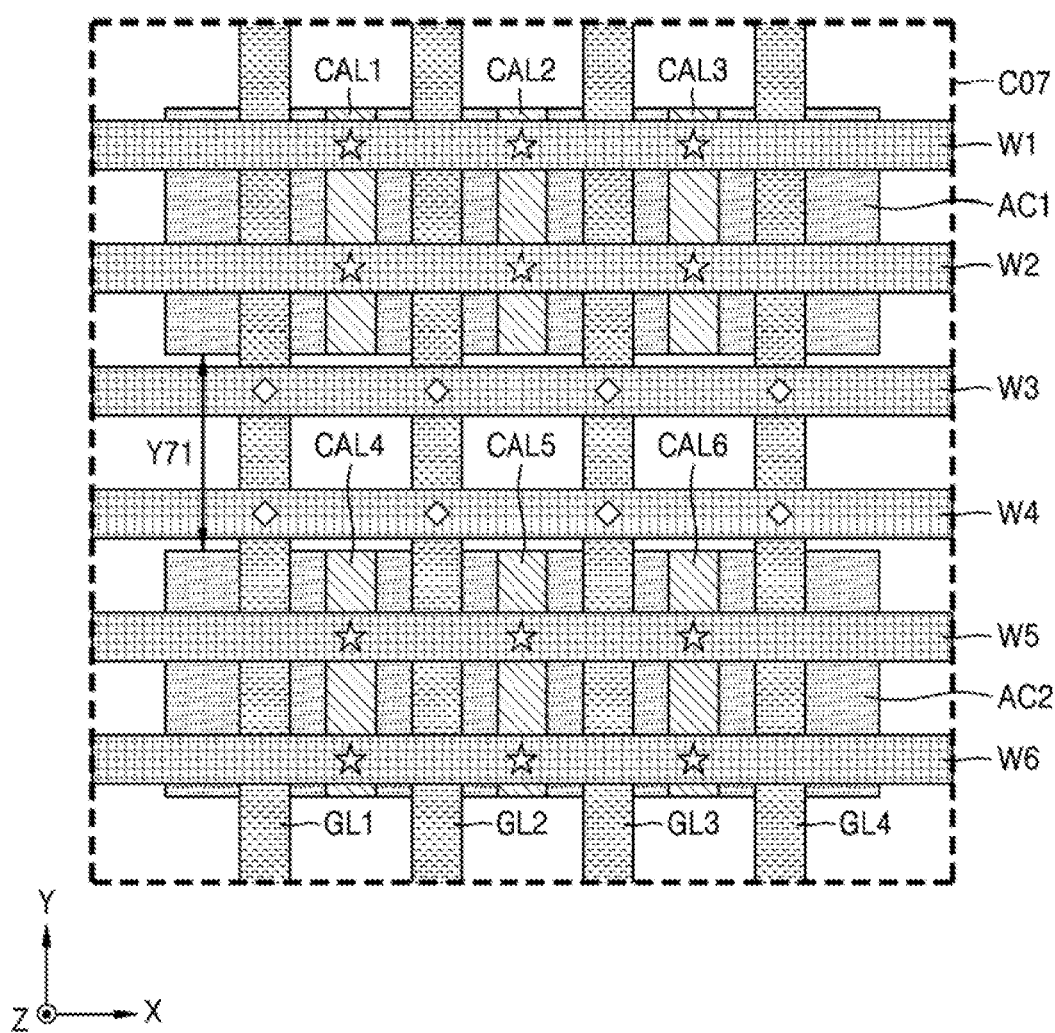
FIG. 7 illustrates a standard cell according to an exemplary embodiment of the inventive concept.

FIG. 7 illustrates a standard cell C07, according to an exemplary embodiment of the inventive concept. In more detail, FIG. 7 is a plan view of a plane with an X-axis and a Y-axis in the standard cell C07, and illustrates candidate points at which a source/drain contact and a gate contact may be connected to conductive lines W1 through W6.

Referring to FIG. 7, the standard cell C07 may include a first active region AC1 and a second active region AC2 which extend in the X-axis direction and are separate from each other, and may include gate lines GL1 through GL4 extending in the Y-axis direction crossing over the first and second active regions AC1 and AC2. In addition, the standard cell C07 may include the conductive lines W1 through W6 that extend in the X-axis direction on a plane separate from the gate lines GL1 through GL4 (e.g., the plane of the conductive lines W1 through W6 is in a +Z direction of the gate lines GL1 through GL4), and the source/drain contact and the gate contact may be connected to the conductive lines W1 through W6.

In an exemplary embodiment of the inventive concept, the gate contact may not be placed over the first and second active regions AC1 and AC2. For example, as illustrated in FIG. 7, two conductive lines W3 and W4 may be placed on a region between the first and second active regions AC1 and AC2, and as marked as '◇', gate contacts may be connected to the two conductive lines W3 and W4. Even if a bridge, that may occur between the source/drain contact and the gate contact, may be removed as described above with reference to FIGS. 1A through 1C, 2A, and 2B, in order to reduce a influence on adjacent element (e.g., an active region) when the gate contact is formed, as illustrated in FIG. 7, the gate contact may be placed over the region between the first and second active regions AC1 and AC2. In this regard, because a bridge occurring between the source/drain contact and the gate contact may be prevented in the standard cell C07 of FIG. 7, the gate contact may be placed close to the first or second active region AC1 or AC2 in a horizontal direction (i.e., the Y-axis direction). Accordingly, similar to the standard cell C04 of FIG. 4, the first active region AC1 and the second active region AC2 may be separate from each other by an active-to-active minimum space in the standard cell C07 of FIG. 7, and Y71 of FIG. 7 may be the same as the active-to-active minimum space. In other words, the standard cell C07 of FIG. 7 described above may have heterogeneous contacts such as those described above with reference to FIGS. 1A through 1C, 2A, and 2B, so that the formation of the contact mutual-bridge may be prevented, and as a result, the Y71 of FIG. 7 may be the same as the active-to-active minimum space.

Figure 8A:
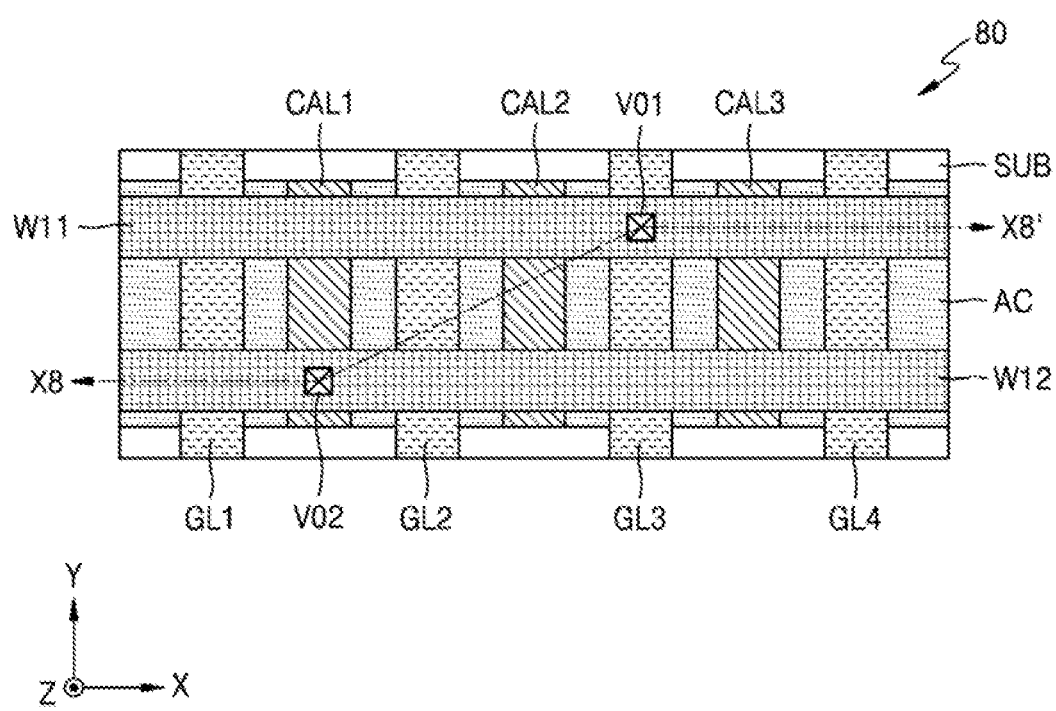
FIG. 8A illustrates a layout of an integrated circuit according to an exemplary embodiment of the inventive concept.
Figure 8B:
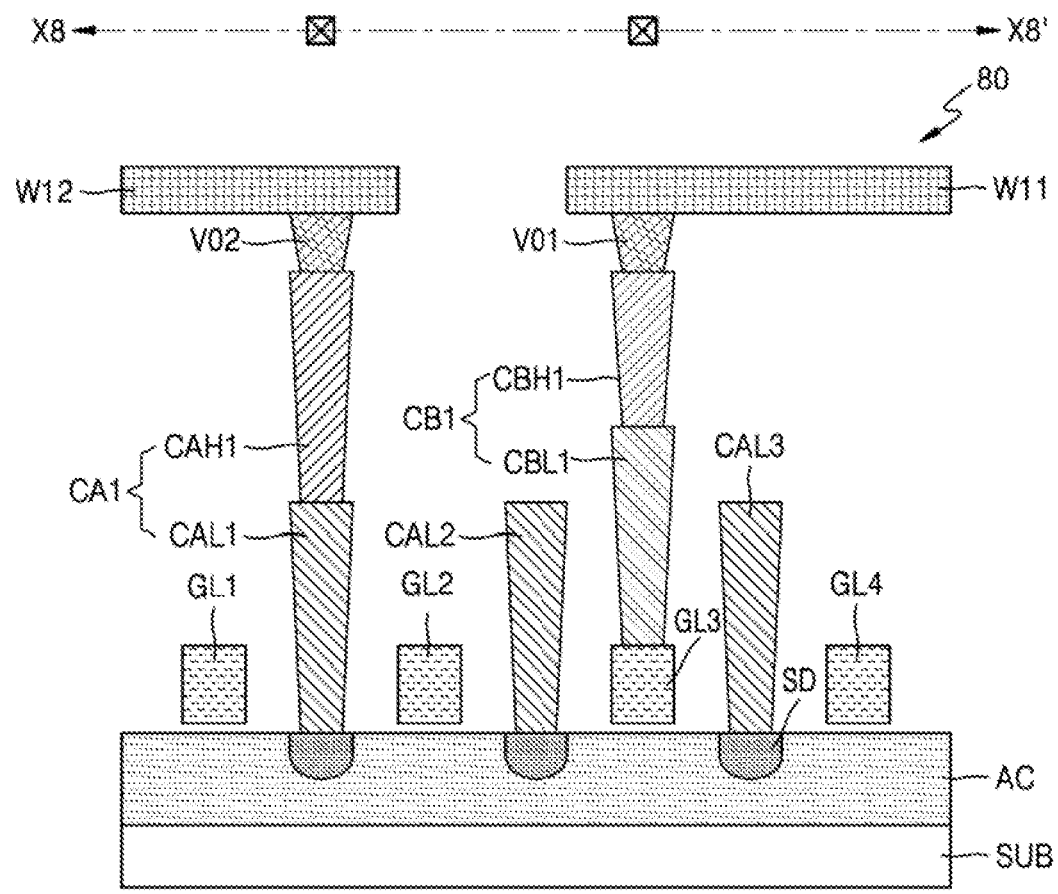
FIG. 8B illustrates an example of a cross section of the integrated circuit taken along line X8-X8' of FIG. 8A according to an exemplary embodiment of the inventive concept.

FIG. 8A illustrates a layout of an integrated circuit 80, according to an exemplary embodiment of the inventive concept. FIG. 8B illustrates an example of a cross section of the integrated circuit 80, taken along line X8-X8' of FIG. 8A, according to an exemplary embodiment of the inventive concept. In more detail, FIG. 8A is a plan view of a plane with an X-axis and a Y-axis in the layout of the integrated circuit 80, and FIG. 8B is a cross-sectional view of the layout of the integrated circuit 80, taken along line X8-X8' of FIG. 8A with the cross-section direction (plane) in parallel with a Z-axis. Hereinafter, descriptions of the integrated circuit 80 in FIGS. 8A and 8B which are the same as the descriptions of the integrated circuit 10 in FIGS. 1A through 1C and the integrated circuit 20 in FIGS. 2A and 2B will be omitted.

Referring to FIGS. 8A and 8B, conductive lines W11 and W12 may extend in the X-axis direction on a plane separate from gate lines GL1 through GL4 (e.g., the plane of the conductive lines W11 and W12 is in the +Z direction of the gate lines GL1 through GL4) that extend in the Y-axis direction. Compared to the conductive lines W1 and W2 of FIGS. 1A and 2A, the conductive lines W11 or W12 of FIG. 8A may be connected to a source/drain contact or a gate contact through a via (e.g., a via V01 or a via V02). In an exemplary embodiment of the inventive concept, the conductive lines W11 and W12 that may be referred to as a metal pattern may interconnect vias placed at different positions, and may be connected to patterns over the conductive lines W11 and W12 through vias.

As illustrated in FIG. 8B, a source/drain contact CA1 may include a lower source/drain contact CAL1 and an upper source/drain contact CAH1 that are connected to each other in a vertical direction (the Z-axis direction). As described above with reference to FIG. 1B, the source/drain contact CA1 including the lower and upper source/drain contacts CAL1 and CAH1 may have a decreased horizontal cross-sectional area in the upper source/drain contact CAH1 portion and the via V02 portion compared to a case where it is formed as one body. The via V02 may extend from a top surface of the upper source/drain contact CAH1 to the conductive line W12 in the Z-axis direction (or the vertical direction), and may connect the source/drain contact CA1 to the conductive line W12.

A gate contact CB1 may include a lower gate contact CBL1 and an upper gate contact CBH1 that are connected to each other in the vertical direction. As described above with reference to FIG. 1C, the gate contact CB1 including the lower gate contact CBL1 and the upper gate contact CBH1 may have a decreased horizontal plane me in the upper gate contact CBH1 portion and the via V01 portion compared to a case where it is formed as one body. The via V01 may extend from a top surface of the upper gate contact CBH1 to the conductive line W11 in the Z-axis direction (or the vertical direction), and may connect the gate contact CB1 to the conductive line W11.

In an exemplary embodiment of the inventive concept, in a different manner from what is illustrated in FIG. 8B, the integrated circuit 80 may include an integrally-formed source/drain contact or an integrally-formed gate contact. In addition, although FIG. 8B illustrates that a top surface of the lower source/drain contact CAL1 and a top surface of the lower gate contact CBL1 are placed on different planes, but the inventive concept is not limited thereto. For example, in an exemplary embodiment of the inventive concept, the top surface of the lower source/drain contact CAL1 and the top surface of the lower gate contact CBL1 may be placed on the same plane. In addition, in an exemplary embodiment of the inventive concept, lower source/drain contacts CAL2 and CAL3 that re not connected to the upper source/drain contact CAH1 in the integrated circuit 80 may be omitted. The integrated circuit 80 of FIGS. 8A and 8B described above may have heterogeneous contacts, so that the formation of the contact mutual-bridge may be prevented, and as a result, the gate contact may be placed over the active region similar to the integrated circuits 10 and 20 described above with reference to FIGS. 1A through 1C, 2A, and 2B.

Figure 9A:
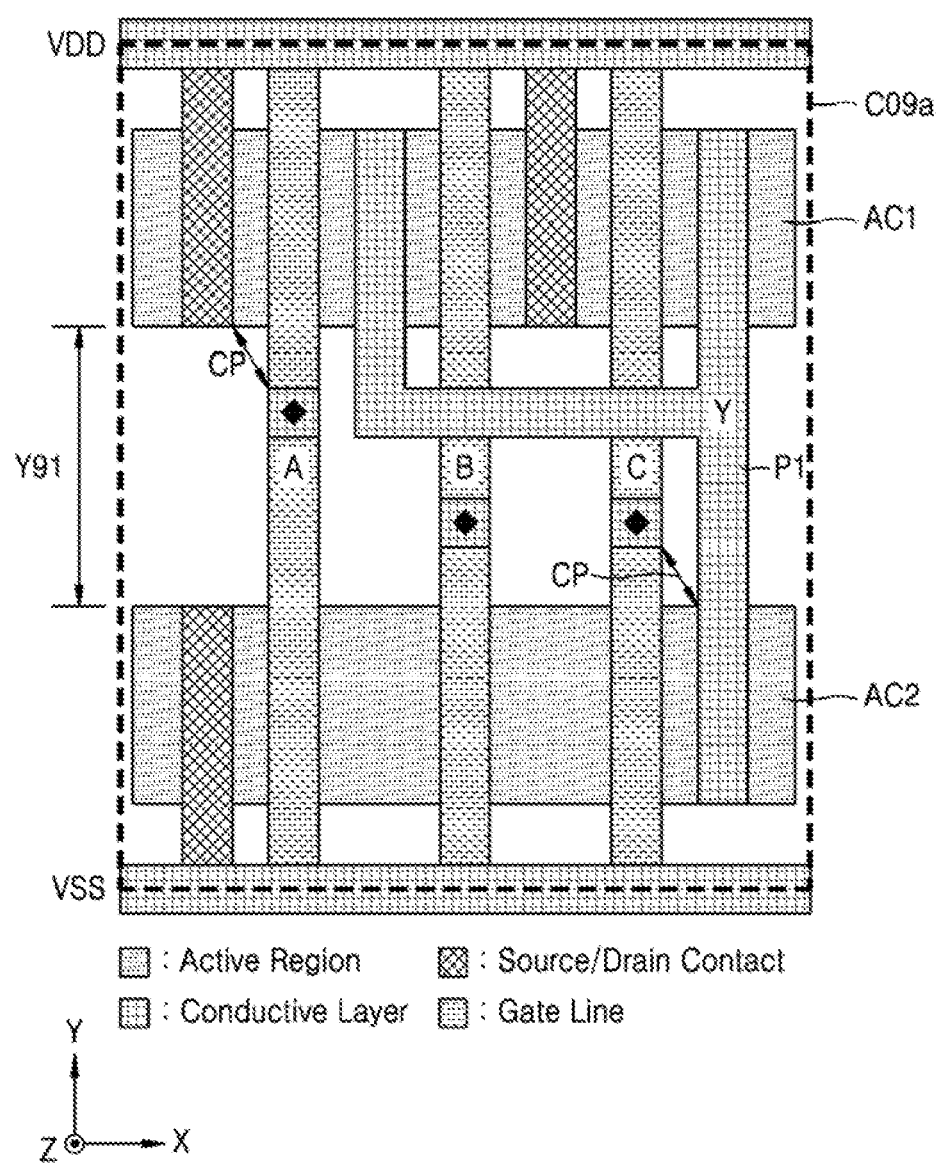
FIG. 9A illustrates a standard cell according to a comparative example.
Figure 9B:
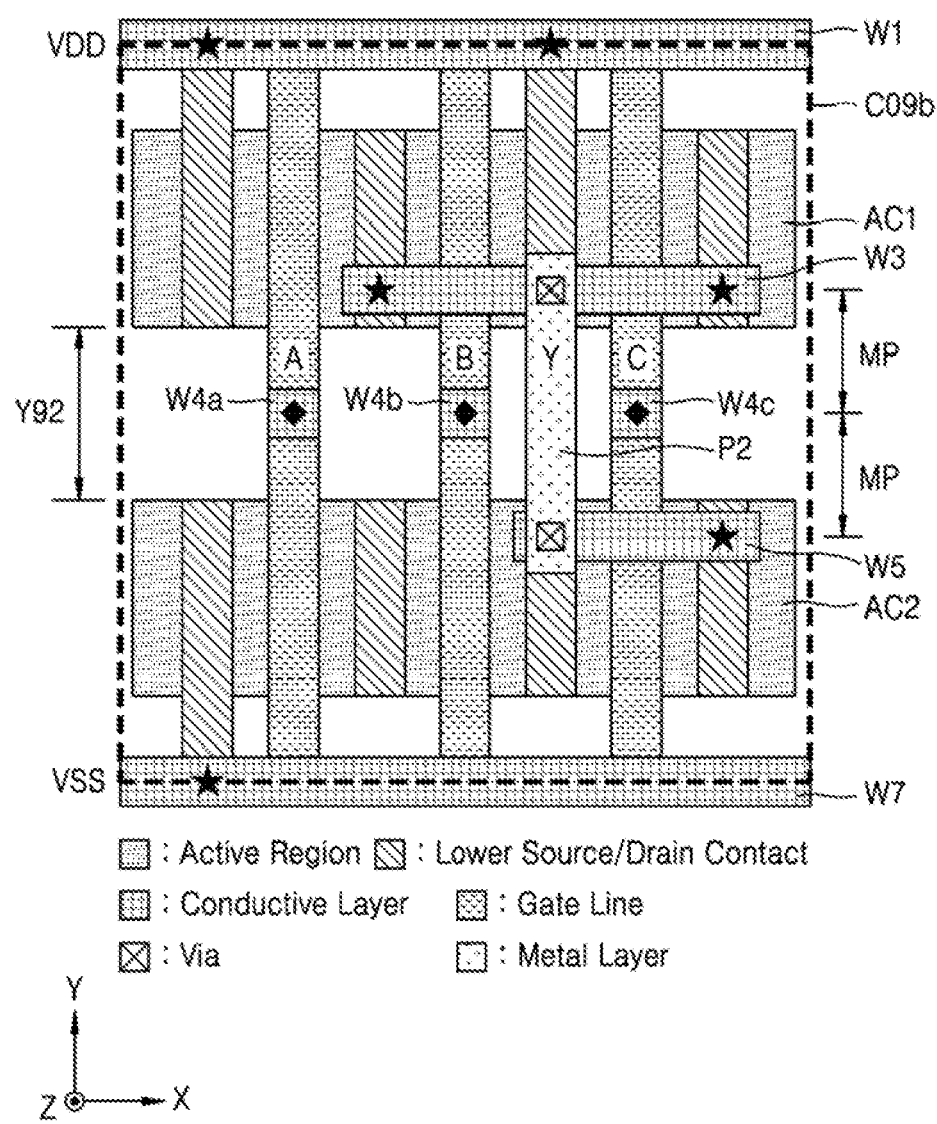
FIG. 9B illustrates a standard cell according to an exemplary embodiment of the inventive concept.

FIG. 9A illustrates a standard cell C09a, according to a comparative example, and FIG. 9B illustrates a standard cell C09b, according to an exemplary embodiment of the inventive concept. In more detail, FIGS. 9A and 9B are plan views of a plane with an X-axis and a Y-axis in each of the standard cells C09a and C09b in which a three-input NAND gate having three inputs A, B, and C and an output Y is embodied. FIGS. 9A and 9B illustrate only elements that are necessary in comparing the standard cells C09a and C09b.

Referring to FIG. 9A, in the standard cell C09a, a source/drain contact may be formed as one body, and a gate contact may also be formed as one body. In the standard cell C09a, a first active region AC1 and a second active region AC2 may be separate from each other by Y91, due to an extra space needed for gate contacts. That is, Y91 in the standard cell C09a may include one Y-axis direction section (e.g., a Y-axis directional length of a region including a point at which a gate contact of the input A is placed) for a contact for a transistor which is formed by the first active region AC1, and another Y-axis direction section (e.g., a Y-axis directional length of a region including points at which gate contacts of the inputs B and C are placed) for a contact for a transistor which is formed by the second active region AC2. In addition, in order to prevent a bridge occurring, the source/drain contact and the gate contact have to be separate from each other by a predetermined distance, i.e., at last CP. Accordingly, Y91 that is a distance between the first active region AC1 and the second active region AC2 in the standard cell C09a may be greater than an active-to-active minimum space.

A pattern P1 of a conductive layer which is to connect source/drain contacts in the standard cell C09a may have a bending or branched shape as illustrated in FIG. 9A. As described above, because semiconductor components and processes are becoming more miniaturized and complex, it may not be easy to precisely form the pattern P1 with the shape, such that an integrated circuit including the standard cell C09a may provide low reliability of a function and low productivity.

Referring to FIG. 9B, a source/drain contact in the standard cell C09b according to the present exemplary embodiment of the inventive concept may include lower and upper source/drain contacts that are connected to each other in a Z-axis direction, and a gate contact may include lower and upper gate contacts that are connected to each other in the Z-axis direction. As described above with reference to FIG. 4, Y92 that corresponds to a separation distance between the first active region AC1 and the second active region AC2 in the standard cell C09b may be the same as an active-to-active minimum space. The standard cell C09b of FIG. 9B described above may have heterogeneous contacts such as those described above with reference to FIGS. 1A through 1C, 2A, and 2B, so that the formation of the contact mutual-bridge may be prevented, and as a result, the Y92 of FIG. 9B may be the same as the active-to-active minimum space. Accordingly, compared to the standard cell C09a of FIG. 9A, the standard cell C09b of FIG. 9B may have a length decreased in the Y-axis direction, and may have an area decreased on the plane with the X-axis and the Y-axis. In the standard cell C09b, source/drain contacts and conductive lines may be connected to each other at points marked as '★', and gate contacts and conductive lines may be connected to each other at points marked as '♦'. As illustrated in FIG. 9B, the source/drain contacts and/or the gate contacts may be connected to some conductive lines W1, W3, W4a, W4b, W4c, W5, and W7 from among conductive lines that are separate from each other by a predetermined distance MP and extend in the X-axis direction, and a pattern P2 of an upper layer of the conductive lines W1, W3, W4a, W4b, W4c, W5, and W7 may extend in the Y-axis direction. Here, MP is the distance between center lines (not the distance of the gap) of two immediately adjacent conductive lines among the conductive lines W3, W4b, W4c and W5. In an exemplary embodiment of the inventive concept, the conductive lines W4a, W4b, and W4c of FIG. 9B may be formed by etching a conductive line that is separate from the conductive lines W3 and W5 by MP. As a result, compared to the standard cell C09a of FIG. 9A, the standard cell C09b may include patterns having a simple shape, so that an integrated circuit including the standard cell C09b may provide high reliability of a function and high productivity.

Figure 10A:
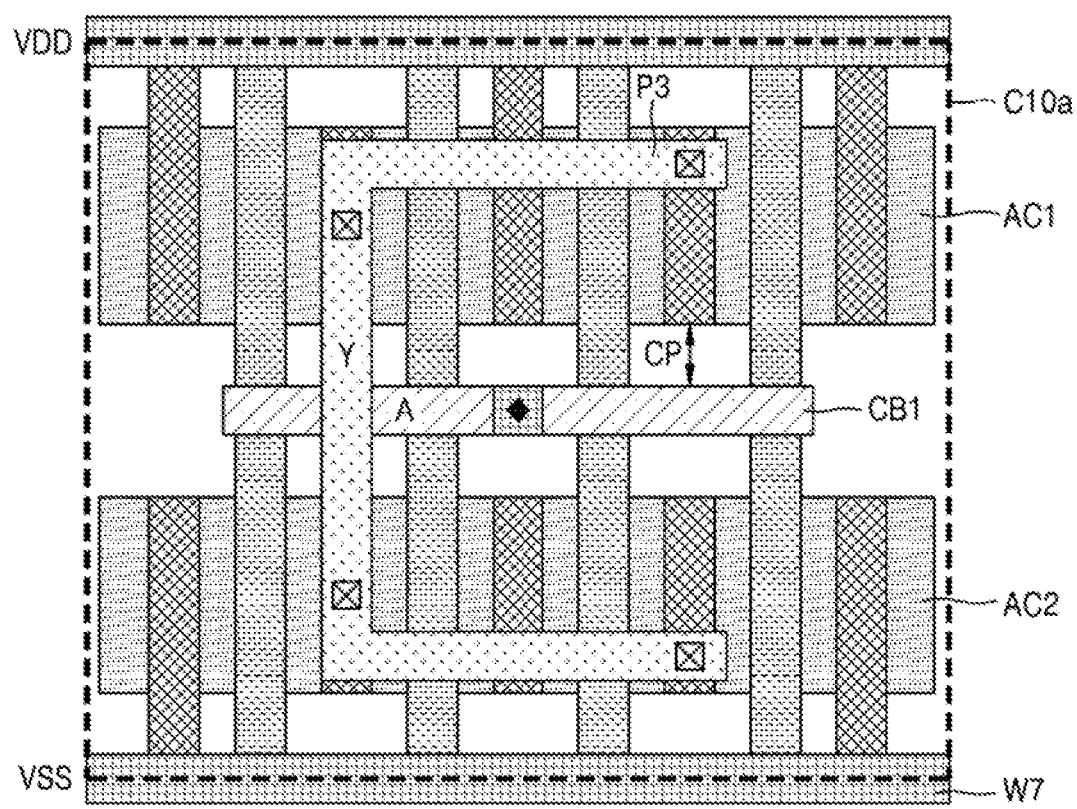
FIG. 10A illustrates a standard cell according to a comparative example.
Figure 10A:
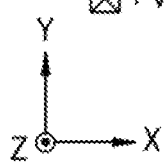
Figure 10B:
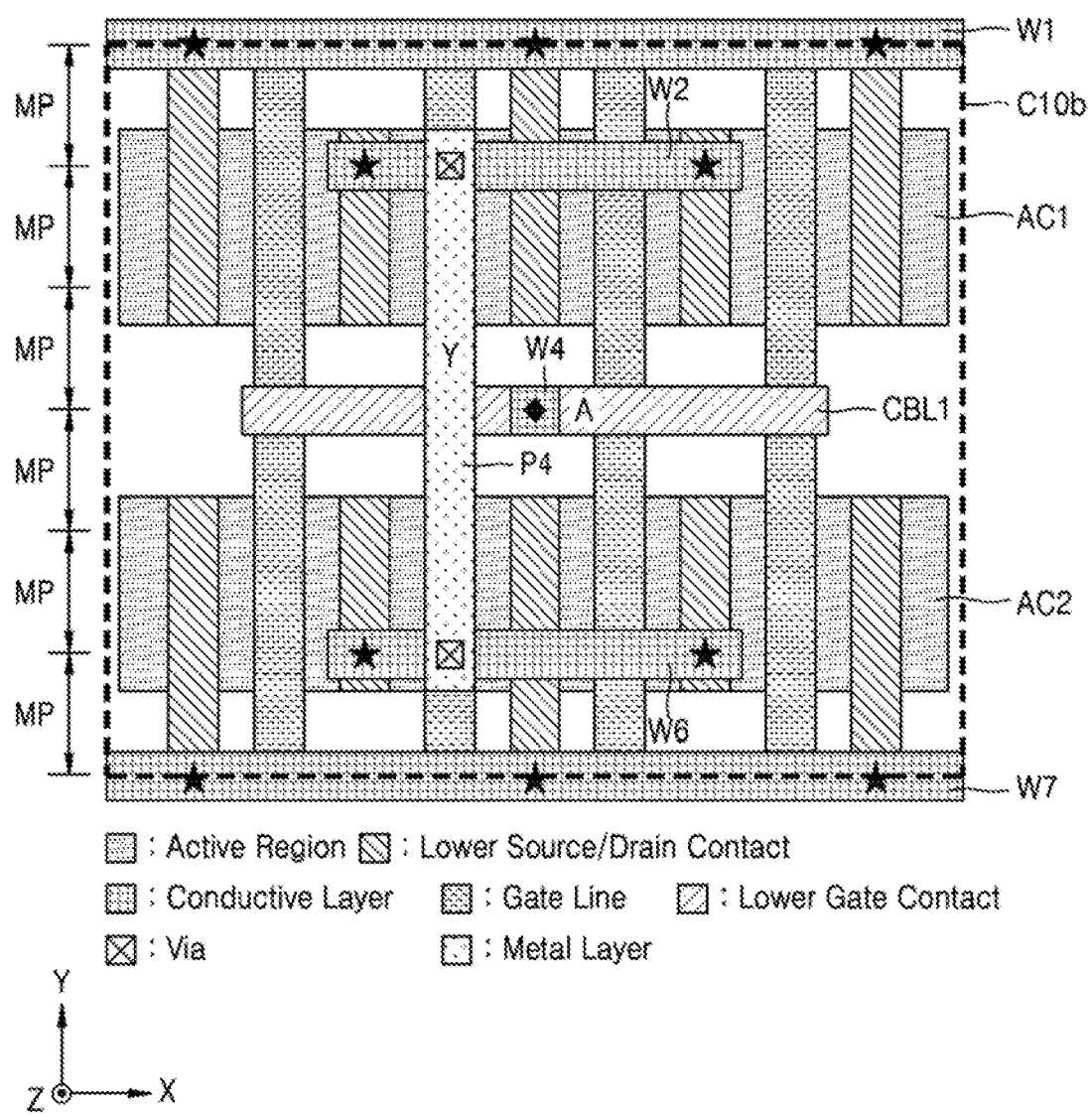
FIG. 10B illustrates a standard cell according to an exemplary embodiment of the inventive concept.

FIG. 10A illustrates a standard cell C10a, according to a comparative example, and FIG. 10B illustrates a standard cell C10b, according to an exemplary embodiment of the inventive concept. In more detail, FIGS. 10A and 10B are plan views of a plane with an X-axis and a Y-axis in the standard cells C10a and C10b in which an inverter having an input A and an output Y is embodied. FIGS. 10A and 10B illustrate only elements that are necessary in comparing the standard cells C10a and C10b.

Referring to FIG. 10A, in the standard cell C10a, a source/drain contact may be formed as one body, and a gate contact may also be formed as one body. That is, a gate contact CB1 formed as one body may be placed over a region between a first active region AC1 and a second active region AC2, and may be separate from the source/drain contact by a distance of CP. As illustrated in FIG. 10A, in the standard cell C10a in which the inverter including four PMOS transistors and four NMOS transistors is embodied, a pattern P3 for the output Y may have a bending shape. As described above, because semiconductor components and processes are becoming more miniaturized and complex, it may not be easy to precisely form the pattern P3 with the shape, such that an integrated circuit including the standard cell C10a may provide low reliability of a function and low productivity.

Referring to FIG. 10B, in the standard cell C10b, a source/drain contact may include lower and upper source/drain contacts that are connected to each other in a Z-axis direction, and a gate contact may include lower and upper gate contacts that are connected to each other in the Z-axis direction. In other words, the standard cell C10b of FIG. 10B described above may have heterogeneous contacts, so that the formation of the contact mutual-bridge may be prevented. The upper source/drain contacts may be placed at points marked as '★' at which the lower source/drain contacts and conductive lines W1, W2, W6, and W7 cross each other, and the upper gate contact may be placed at a point marked as '♦' at which a lower gate contact CBL1 and a conductive line W4 cross each other. As illustrated in FIG. 10B, source/drain contacts and/or gate contacts may be connected to some conductive lines W1, W2, W4, W6, and W7 from among conductive lines that are separate from each other by a predetermined distance MP and extend in an X-axis direction, and a pattern P4 of an upper layer of the conductive lines W1, W2, W4, W6, and W7 may extend in a Y-axis direction. Here, MP is the distance between center lines (not the distance of the gap) of two immediately adjacent conductive lines, for example, between the conductive lines W1 and W2, and between conductive lines W6 and W7. Similar to the standard cell C09b of FIG. 9B, compared to the standard cell C10a of FIG. 10A, the standard cell C10b of FIG. 10B may also include patterns having a simple shape, so that an integrated circuit including the standard cell C10b may provide high reliability of a function and high productivity.

Figure 11:
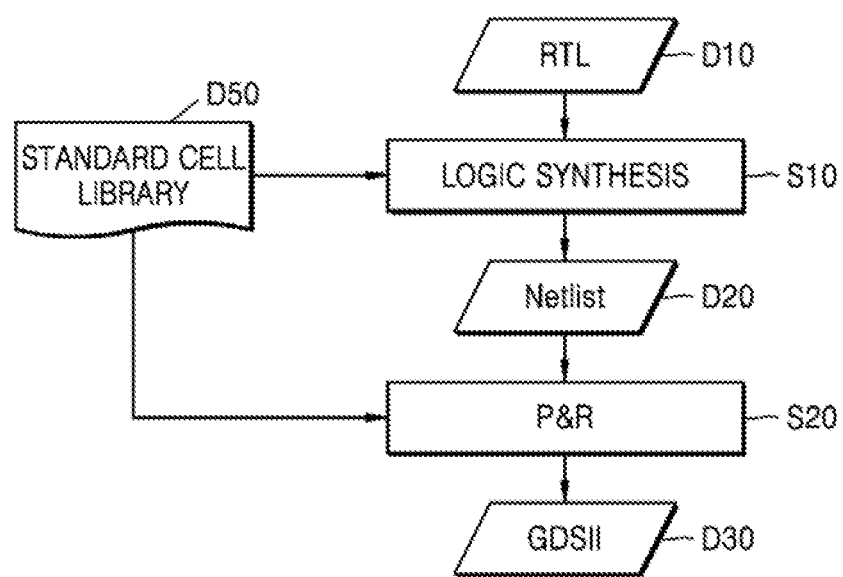
FIG. 11 is a flowchart of a method of designing a layout of an integrated circuit having heterogeneous contacts according to an exemplary embodiment of the inventive concept.

FIG. 11 is a flowchart of a method of designing a layout of an integrated circuit having heterogeneous contacts, according to an exemplary embodiment of the inventive concept. As illustrated in FIG. 11, a standard cell library D50 may include information about a plurality of standard cells, e.g., function information, characteristic information, layout information, etc., and a layout of a standard cell may include contacts and conductive lines that are placed according to the aforementioned exemplary embodiments of the inventive concept.

Referring to FIG. 11, in operation S10, a logic synthesis operation of generating netlist data D20 from RTL data D10 may be performed. For example, a semiconductor design tool (e.g., a logic synthesis tool) may perform logic synthesis by taking into account the standard cell library D50, such that the semiconductor design tool may generate the netlist data D20 including a bitstream or a netlist from the RTL data D10 generated by a Hardware Description Language (HDL) such as Very High Speed Integrated Circuit (VHSIC) Hardware Description Language (VHDL) and Verilog. According to the present exemplary embodiment of the inventive concept, in the logic synthesis operation, the semiconductor design tool may refer to the standard cell library D50 including the characteristic information about the standard cell including at least some conductive lines placed to be parallel with each other and contacts connected to some of the at least some conductive lines, and may include an instance of the standard cell in an integrated circuit. The standard cell in the standard cell library D50 may include, for example, one or more of the standard cells C04, C05, C06, C07, C09b and C10b according to the exemplary embodiments of the inventive concept described above.

In operation S20, a place and route (PAR) operation of generating layout data D30 from the netlist data D20 may be performed. For example, the semiconductor design tool (e.g., a P&R tool) may generate, from the netlist data D20, the layout data D30 having the same format as GDSII by placing and routing the plurality of standard cells by taking into account the standard cell library D50. According to the present exemplary embodiment of the inventive concept, the semiconductor design tool may place and route an instance of a standard cell including a contact and conductive lines extending in one direction and being connected to the contact that includes a lower contact and an upper contact which are vertically connected to each other, so that the semiconductor design tool may generate the layout of the integrated circuit which has a decreased area based on a decreased area of the standard cell.

Figure 12:
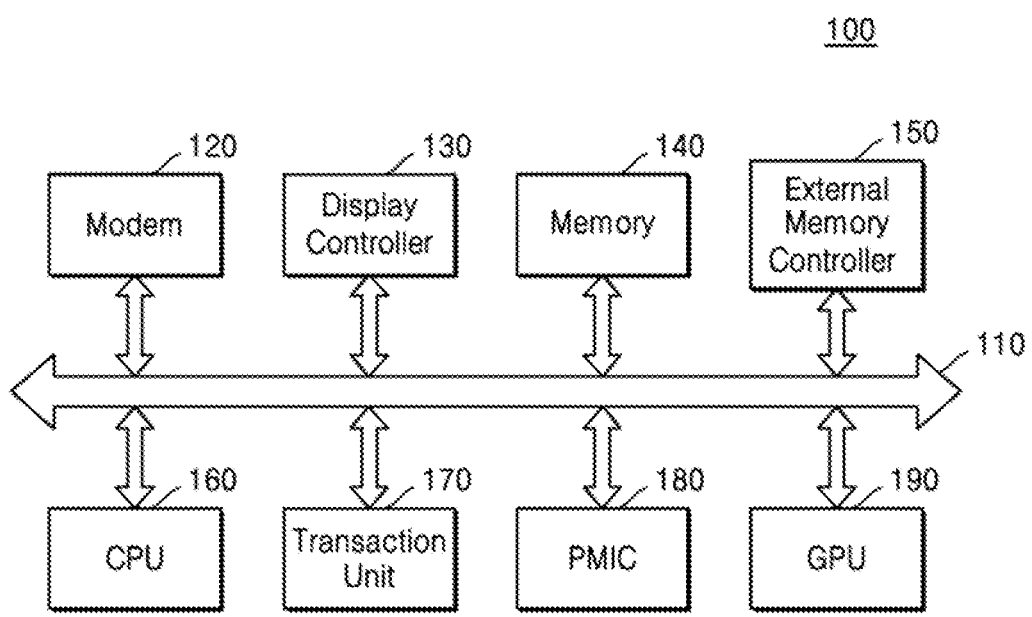
FIG. 12 is a block diagram illustrating a system on chip (SoC) according to an exemplary embodiment of the inventive concept.

FIG. 12 is a block diagram illustrating a system on chip (SoC) 100, according to an exemplary embodiment of the inventive concept. The SoC 100 is a semiconductor device that may include an integrated circuit according to an exemplary embodiment of the inventive concept. The SoC 100 indicates a chip in which complicated function blocks such as an intellectual property (IP) are embodied, and in this regard, a standard cell according to one or more exemplary embodiments of the inventive concept may be included in each of the function blocks of the SoC 100, such that the SoC 100 having a decreased area and high reliability of a function may be achieved.

Referring to FIG. 12, the SoC 100 may include a modem 120, a display controller 130, a memory 140, a external memory controller 150, a central processing unit (CPU) 160, a transaction unit 170, a power management integrated circuit (PMIC) 180, and a graphic processing unit (GPU) 190, and the function blocks of the SoC 100 may communicate with each other via a system bus 110.

The CPU 160 capable of generally controlling an operation of the SoC 100 may control operations of other function blocks 120, 130, 140, 150, 170, 180, and 190. The modem 120 may demodulate a signal received from a source outside the SoC 100, or may modulate a signal generated in the SoC 100 and may transmit the signal to an external source. The external memory controller 150 may control an operation of exchanging data with an external memory device connected to the SoC 100. For example, a program and/or data stored in the external memory device may be provided to the CPU 160 or the GPU 190 by the control of the external memory controller 150. The GPU 190 may execute program instructions with respect to graphic processing. The GPU 190 may receive graphic data via the external memory controller 150, and may transmit graphic data, which is processed by the GPU 190, to a source outside the SoC 100 via the external memory controller 150. The transaction unit 170 may monitor data transaction between the function blocks, and the PMIC 180 may control power to be supplied to each of the function blocks by the control of the transaction unit 170. The display controller 130 may control a display (or a display apparatus) outside the SoC 100, thereby transmitting data generated in the SoC 100 to the display.

The memory 140 may include a non-volatile memory such as an Electrically Erasable Programmable Read-Only Memory (EEPROM), a flash memory, a Phase Change Random Access Memory (PRAM), a Resistance Random Access Memory (RRAM), a Nano Floating Gate Memory (NFGM), a Polymer Random Access Memory (PoRAM), a Magnetic Random Access Memory (MRAM), a Ferroelectric Random Access Memory (MRAM), or the like, and may include a volatile memory such as a Dynamic Random Access Memory (DRAM), a Static Random Access Memory (SRAM), a mobile DRAM, a Double Data Rate Synchronous Dynamic Random Access Memory (DDR SDRAM), a Low Power DDR (LPDDR) SDRAM, a Graphic DDR (GDDR) SDRAM, a Rambus Dynamic Random Access Memory (RDRAM), or the like.

While the inventive concept has been particularly shown and described with reference to the specific exemplary embodiments thereof, it will be understood by those of ordinary skill in the art that various changes in form and details may be made therein without departing from the spirit and scope of the inventive concept as defined by the appended claims. The exemplary embodiments should be considered in a descriptive sense only and not for purposes of limitation.

What is claimed is:

1. An integrated circuit comprising:
   a first active region and a second active region which extend parallel with each other in a first horizontal direction on a substrate;

a plurality of gate lines extending in a second horizontal direction on the first and second active regions, the second horizontal direction crossing the first horizontal direction;

a plurality of source/drain regions formed at respective sides of the plurality of gate lines on the first and second active regions;

a plurality of conductive lines extending parallel with each other in the first horizontal direction on a plane separate from the plurality of gate lines;

a plurality of source/drain contacts each having a bottom surface connected to one of the plurality of source/drain regions, and each extending in a vertical direction; and a plurality of gate contacts each having a bottom surface connected to one of the plurality of gate lines, and each comprising a lower gate contact and an upper gate contact which are directly connected to each other in the vertical direction and each formed as one body, with the lower gate contact directly connected to the one of the plurality of gate lines, wherein the plurality of source/drain contacts and upper gate contacts of the plurality of gate contacts are placed below the plurality of conductive lines, respectively, a top surface of the lower gate contact is larger than a bottom surface of the upper gate contact, at least one of the plurality of conductive lines splits into two conductive lines, and at least one lower gate contact of the plurality of gate contacts extends in the first horizontal direction and connects the two conductive lines.

2. The integrated circuit of claim 1, wherein each of the plurality of source/drain contacts comprises a lower source/drain contact and an upper source/drain contact which are connected to each other in the vertical direction.

3. The integrated circuit of claim 1, wherein each of the plurality of source/drain contacts and each of the upper gate contacts of the plurality of gate contacts are connected to at least one of the plurality of conductive lines.

4. The integrated circuit of claim 1, wherein at least one of the upper gate contacts of the plurality of gate contacts is placed on the first active region.

5. The integrated circuit of claim 1, wherein the first active region and the second active region are separate from each other on the substrate by an active-to-active minimum space defined by a design rule.

6. An integrated circuit comprising:

a first active region and a second active region which extend parallel with each other in a first horizontal direction on a substrate;

a plurality of gate lines extending in a second horizontal direction on the first and second active regions, the second horizontal direction crossing the first horizontal direction;

a plurality of source/drain regions formed at respective sides of the plurality of gate lines on the first and second active region;

a plurality of conductive lines extending parallel with each other in the first horizontal direction on a plane separate from the plurality of gate lines;

a plurality of source/drain contacts each having a bottom surface connected to one of the plurality of source/drain regions, and each extending in a vertical direction;

a plurality of gate contacts each having a bottom surface connected to one of the plurality of gate lines, and each comprising a lower gate contact and an upper gate contact which are directly connected to each other in the vertical direction and each formed as one body, with the lower gate contact directly connected to the one of the plurality of gate lines;

a plurality of first vias respectively connecting the plurality of source/drain contacts to one or more of the plurality of conductive lines; and a plurality of second vias respectively connecting the upper gate contacts of the plurality of gate contacts to one or more of the plurality of conductive lines, wherein the plurality of source/drain contacts and upper gate contacts of the plurality of gate contacts are placed below the plurality of conductive lines, respectively, and a top surface of the lower gate contact is larger than a bottom surface of the upper gate contact.

\* \* \* \* \*